US009559183B2

(12) United States Patent
Inoue et al.

(10) Patent No.: US 9,559,183 B2
(45) Date of Patent: Jan. 31, 2017

(54) SEMICONDUCTOR DEVICE WITH VARYING THICKNESS OF INSULATING FILM BETWEEN ELECTRODE AND GATE ELECTRODE AND METHOD OF MANUFACTURING SEMICONDUCTOR DEVICE

(71) Applicant: Renesas Electronics Corporation, Kawasaki-shi (JP)

(72) Inventors: Takashi Inoue, Kawasaki (JP); Tatsuo Nakayama, Kawasaki (JP); Yasuhiro Okamoto, Kawasaki (JP); Hiroshi Kawaguchi, Kawasaki (JP); Toshiyuki Takewaki, Kawasaki (JP); Nobuhiro Nagura, Kawasaki (JP); Takayuki Nagai, Kawasaki (JP); Yoshinao Miura, Kawasaki (JP); Hironobu Miyamoto, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/271,277

(22) Filed: May 6, 2014

(65) Prior Publication Data
US 2014/0353720 A1 Dec. 4, 2014

(30) Foreign Application Priority Data
Jun. 3, 2013 (JP) ................................. 2013-116659

(51) Int. Cl.
*H01L 29/778* (2006.01)
*H01L 29/201* (2006.01)
(Continued)

(52) U.S. Cl.
CPC ........... *H01L 29/513* (2013.01); *H01L 29/402* (2013.01); *H01L 29/4236* (2013.01);
(Continued)

(58) Field of Classification Search
CPC ........... H01L 29/2003; H01L 29/66462; H01L 29/4236; H01L 29/7786; H01L 29/7787; H01L 9/7787
See application file for complete search history.

(56) References Cited

U.S. PATENT DOCUMENTS 7,075,125 B2    7/2006   Saito et al.
7,449,762 B1 *   11/2008   Singh ................ H01L 29/66522
                                                       257/279
(Continued)

FOREIGN PATENT DOCUMENTS

JP     2009-200096 A    9/2009
JP     4417677 B2    2/2010
(Continued)

OTHER PUBLICATIONS

European Search Report dated Oct. 28, 2014.
(Continued)

*Primary Examiner* — Victor A Mandala
*Assistant Examiner* — Regan J Rundio
(74) *Attorney, Agent, or Firm* — McGinn IP Law Group, PLLC.

(57) ABSTRACT

To provide a semiconductor device having improved characteristics. The semiconductor device has a substrate and thereon a buffer layer, a channel layer, a barrier layer, a trench penetrating therethrough and reaching the inside of the channel layer, a gate electrode placed in the trench via a gate insulating film, and drain and source electrodes on the barrier layer on both sides of the gate electrode. The gate insulating film has a first portion made of a first insulating
(Continued)

film and extending from the end portion of the trench to the side of the drain electrode and a second portion made of first and second insulating films and placed on the side of the drain electrode relative to the first portion. The on resistance can be reduced by decreasing the thickness of the first portion at the end portion of the trench on the side of the drain electrode.

12 Claims, 32 Drawing Sheets

(51) Int. Cl.
| | |
|---|---|
| H01L 29/205 | (2006.01) |
| H01L 29/51 | (2006.01) |
| H01L 29/78 | (2006.01) |
| H01L 29/66 | (2006.01) |
| H01L 29/423 | (2006.01) |
| H01L 29/40 | (2006.01) |
| H01L 21/336 | (2006.01) |
| H01L 29/45 | (2006.01) |
| H01L 29/20 | (2006.01) |

(52) U.S. Cl.
CPC .. *H01L 29/42368* (2013.01); *H01L 29/42376* (2013.01); *H01L 29/66431* (2013.01); *H01L 29/66462* (2013.01); *H01L 29/7783* (2013.01); *H01L 29/7787* (2013.01); *H01L 29/7827* (2013.01); *H01L 29/2003* (2013.01); *H01L 29/452* (2013.01)

(56) References Cited

U.S. PATENT DOCUMENTS

| 8,207,574 | B2 | 6/2012 | Kaneko | | |
|---|---|---|---|---|---|
| 2007/0164326 | A1 | 7/2007 | Okamoto et al. | | |
| 2009/0206371 | A1 | 8/2009 | Oka | | |
| 2010/0127275 | A1* | 5/2010 | Takehiko | H01L 29/7787 | 257/76 |
| 2010/0314663 | A1* | 12/2010 | Ito | H01L 29/1083 | 257/192 |
| 2011/0062438 | A1* | 3/2011 | Kaneko | H01L 29/42316 | 257/43 |
| 2011/0316048 | A1* | 12/2011 | Ikeda et al. | | 257/192 |
| 2012/0241751 | A1* | 9/2012 | Yoshioka | H01L 29/7787 | 257/76 |
| 2014/0021481 | A1* | 1/2014 | Lee | H01L 29/2003 | 257/76 |
| 2015/0145004 | A1* | 5/2015 | Inoue | H01L 29/4236 | 257/192 |
| 2015/0270355 | A1* | 9/2015 | Kuraguchi | H01L 29/778 | 257/194 |

FOREIGN PATENT DOCUMENTS

| JP | 2010-153837 A | 7/2010 |
|---|---|---|
| JP | 2010-238838 A | 10/2010 |
| JP | 4888115 B2 | 2/2012 |

OTHER PUBLICATIONS

K. Ota et al., "A Normally-off GaN FET with High Threshold Voltage Uniformity Using a Novel Piezo Neutralization Technique", Nano Electronics Research Laboratories, NEC Corporation, 2009.

N. Ikeda et al., "Over 1.7Kv normally-off GaN hybrid MOS-HFETs with a lower on-resistance on Si substrate;" Advanced Power Device Research Association, Yokohama City, Kanagawa, Japan, 2011.

N. Maeda et al., "Systematic Study of Insulator Deposition Effect ($Si_3N_4$, $SiO_2$, AlN, and $Al_2O_3$) on Electrical Properties in AlGaN/GaN Heterostructures.," Feb. 8, 2007.

N. Onojima et al., "Reduction in potential barrie height of AlGaN heterostructures by SiN passivation", J. Appl. Phys. 101, 043703 (2007); doi: 10.1063/1.2472255.

European Office Action dated Aug. 14, 2015.

Japanese Office Action dated Sep. 13, 2016 with an English translation.

* cited by examiner

SEMICONDUCTOR DEVICE WITH VARYING THICKNESS OF INSULATING FILM BETWEEN ELECTRODE AND GATE ELECTRODE AND METHOD OF MANUFACTURING SEMICONDUCTOR DEVICE

CROSS-REFERENCE TO RELATED APPLICATIONS

The disclosure of Japanese Patent Application No. 2013-116659 filed on Jun. 3, 2013 including the specification, drawings, and abstract is incorporated herein by reference in its entirety.

BACKGROUND

The present invention relates to a semiconductor device and a method of manufacturing a semiconductor device, which can be preferably used for, for example, a semiconductor device using a nitride semiconductor and a method of manufacturing the device.

In recent years, semiconductor devices using a group III-V compound having a band gap greater than that of Si have attracted attentions. Among them, semiconductor devices using gallium nitride (GaN) having the following advantages is under development: 1) having a great dielectric breakdown field, 2) having a great electron saturation velocity, 3) having a great thermal conductivity, 4) capable of forming a good hetero junction between AlGaN and GaN, and 5) they are non-toxic and highly safe materials.

Further, semiconductor devices which are power MISFETs (metal insulator semiconductor field effect transistors) using gallium nitride and capable of a normally-off operation are under development from the standpoint of its high breakdown voltage and fast switching characteristics.

For example, the following Non-patent Document 1 discloses a MISFET using a hetero junction between AlGaN and GaN and having a structure in which a gate recess is made on the back side relative to the hetero junction in order to achieve a normally-off operation.

The following Non-patent Document 2 discloses a MISFET fabricated by, when making a gate recess on the back side relative to a hetero junction, using an insulating film having a patterned opening as a mask and leaving the insulating film in the device.

The following Non-patent Document 3 includes a description on an effect of reducing the surface potential of AlGaN when a nitride film is used as a surface protective film of an AlGaN/GaN hetero-junction type epi. It discloses, for example, that the surface potential reducing effect is markedly large when the nitride film is formed using Cat-CVD (catalytic chemical vapor deposition.

The following Non-patent Document 4 includes a description on, when various protective films formed by ECR sputtering are used as a surface protective film of an AlGaN/GaN hetero-junction type epi, a surface potential barrier height and an interfacial sheet charge density at the interface between the surface protective film and AlGaN.

The following Patent Document 1 discloses a heterojunction field effect transistor which is not a transistor with a gate recess but has a field plate layer whose thickness shows a stepwise change.

The following Patent Documents 2 and 3 disclose a semiconductor device which is not a transistor with a gate recess but has a first field plate electrode integrated with a gate electrode and a second field plate electrode integrated with a source electrode.

Patent Documents
 [Patent document 1] Japanese Patent No. 4888115
 [Patent Document 2] Japanese Patent No. 4417677
 [Patent Document 3] U.S. Pat. No. 7,075,125
Non-Patent Documents
 [Non-patent Document 1] N. Ikeda et al., "Over 1.7 kV normally-off GaN hybrid MOS-HFETs with a lower on-resistance on a Si substrate", IE3 International Symposium on Power Semiconductor Devices and ICs (ISPSD), pp. 284-287, 2011.
 [Non-patent Document 2] K. Ota et al., "A Normally-off GaN FET with High Threshold Voltage Uniformity Using A Novel Piezo Neutralization Technique", International Electron Device Meeting (IEDM) 2009, IEDM09-154, 2009.
 [Non-patent Document 3] N. Onojima et al., "Reduction in potential barrier height of AlGaN/GaN heterostructures by SiN passivation", J. Appl. Phys. 101, 043703 (2007).
 [Non-patent Document 4] N. Maeda et al., "Systematic Study of Deposition Effect ($Si_3N_4$, $SiO_2$, AlN, and $Al_2O_3$) on Electrical Properties in AlGaN/GaN Heterostructures", Jpn. J. Appl. Phys., Vol. 46, No. 2 (2007), pp. 547-554

SUMMARY

The present inventors are engaged in research and development of semiconductor devices using a nitride semiconductor as described above and have carried out an extensive investigation with a view to improving the characteristics of normally-off semiconductor devices. During the investigation, they have found that there is a room for further improvement in the characteristics of a semiconductor device using a nitride semiconductor.

The other problems and novel features will be apparent from the description herein and accompanying drawings.

Of the embodiments disclosed herein, typical ones will next be outlined briefly.

A semiconductor device according to one embodiment disclosed herein has a gate electrode placed in a trench via a gate insulating film. This gate insulating film is configured to have a first portion extending from an end portion of the trench to the side of a first electrode and located on the side of the end portion of the trench and a second portion located on the side of the first electrode relative to the first portion and having a film thickness greater than that of the first portion.

A method of manufacturing a semiconductor device according to one embodiment disclosed herein has the steps of: etching a stacked body of a first nitride semiconductor layer and a second nitride semiconductor layer with a first film as a mask to form a trench penetrating through the second nitride semiconductor layer and reaching the inside of the first nitride semiconductor layer. After an end portion of the first film is caused to retreat from an end portion of the trench, a second film is formed on the first film including that inside the trench.

The semiconductor device disclosed herein and shown below in a typical embodiment is able to have improved characteristics.

In addition, according to the method of manufacturing a semiconductor device disclosed herein and shown below in a typical embodiment, a semiconductor device having good characteristics can be manufactured.

DETAILED DESCRIPTION

Figure 1:
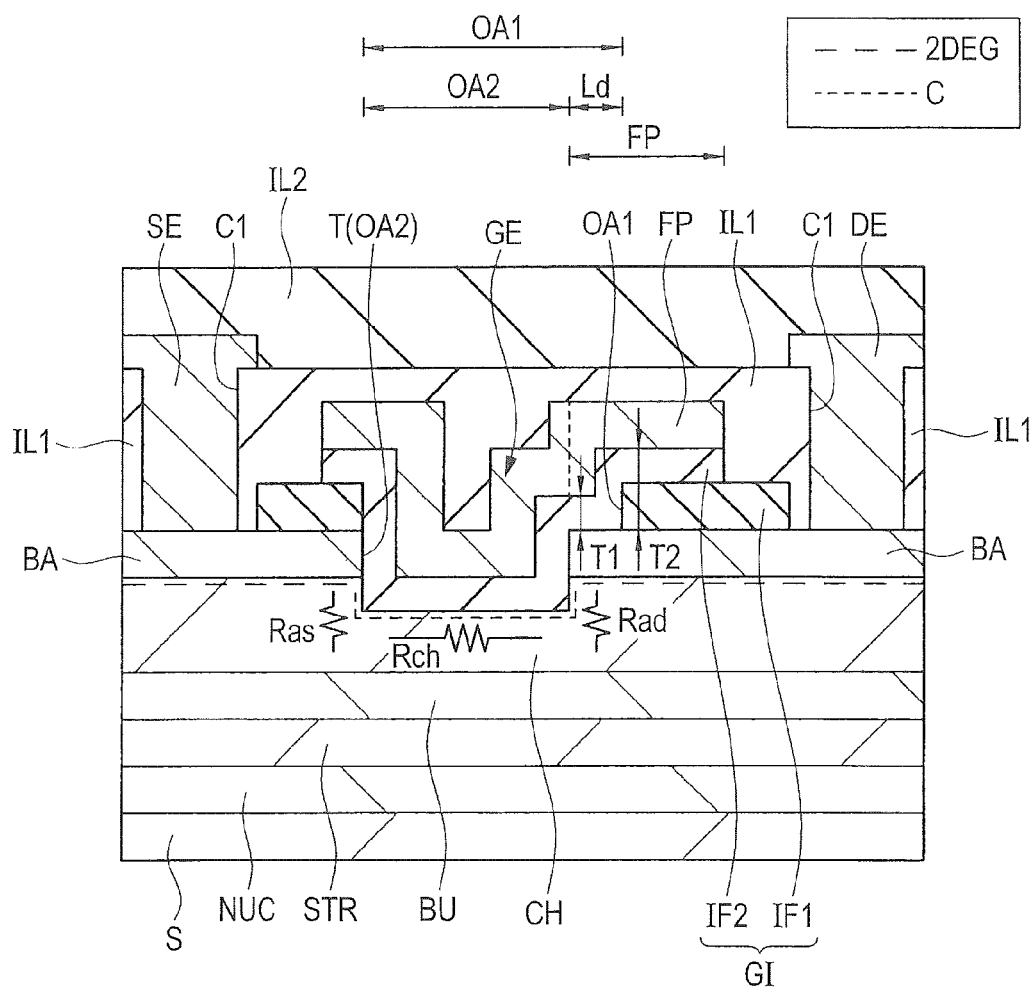
FIG. 1 is a cross-sectional view showing the configuration of a semiconductor device of First Embodiment.

In the below-described embodiments, a description will be made after divided into a plurality of sections or embodiments if necessary for convenience sake. They are not independent from each other, but in a relation such that one is a modification example, application example, detailed description, a complementary description, or the like of a part or whole of the other one unless otherwise specifically indicated. And, in the below-described embodiments, when a reference is made to the number of elements (including the number, value, amount, range, or the like), the number is not limited to a specific number but may be more or less than the specific number, unless otherwise specifically indicated or principally apparent that the number is limited to the specific number.

Further, in the below-described embodiments, the constituent component (including constituent step or the like) is not always essential unless otherwise specifically indicated or principally apparent that it is essential. Similarly, in the below-described embodiments, when a reference is made to the shape, positional relationship, or the like of the constituent component, that substantially approximate or analogous to it is also embraced unless otherwise specifically indicated or principally apparent that it is not. This also applies to the above-described number (number, value, amount, range, and the like).

Embodiments will hereinafter be described in detail based on some drawings. In all the drawings for describing the embodiments, members of a like function will be identified by like reference numerals or related reference numerals and overlapping descriptions will be omitted. When there are two or more members (sites) analogous to each other, individual or specific sites may be indicated by a generic reference numeral followed by a symbol. In the below-described embodiments, a description on the same or similar portion is not repeated in principle unless otherwise particularly necessary.

In the drawings to be used in the following embodiments, even a cross-sectional view is sometimes not hatched to facilitate understanding of it.

In the cross-sectional view, the size of each site does not correspond to that of an actual device. To facilitate understanding of the drawing, some sites may be shown in a relatively large size.

(First Embodiment)

Referring to drawings, a semiconductor device of the present embodiment will hereinafter be described in detail. FIG. 1 is a cross-sectional view showing the configuration of the semiconductor device of the present embodiment. FIGS. 2 to 16 are cross-sectional views showing manufacturing steps of the semiconductor device of the present embodiment, respectively.

[Description on Structure]

FIG. 1 is a cross-sectional view showing the configuration of the semiconductor device of the present embodiment. The semiconductor device shown in FIG. 1 is a MIS (metal insulator semiconductor) type field effect transistor (FET) using a nitride semiconductor. This semiconductor device is also called "high electron mobility transistor" or power transistor. The semiconductor device of the present embodiment is a so-called recess gate type semiconductor device.

The semiconductor device of the present embodiment has, on a substrate S thereof, a nucleus forming layer NUC, a strain relaxing layer STR, a buffer layer BU, a channel layer (also called "electron transit layer") CH, and a barrier layer BA stacked one after another in the order of mention. The gate electrode GE lies, via a gate insulating film GI, in a trench T that penetrates through the barrier layer BA and reaches the inside of the channel layer. The channel layer CH and the barrier layer BA are made of a nitride semiconductor and the barrier layer BA is made of a nitride semiconductor having a band gap wider than that of the channel layer CH.

A two-dimensional electron gas 2DEG is formed on the side of the channel layer CH in the vicinity of the interface between the channel layer CH and the barrier layer BA. When a positive electric potential (threshold potential) is applied to the gate electrode GE, a channel C is formed in the vicinity of the interface between the gate insulating film GI and the channel layer CH. As resistance of a region in which the channel C is formed, there are a channel resistance Rch which is a MIS channel resistance generated along the bottom surface of the trench T, a channel resistance Ras which is a MIS channel resistance generated along the side surface (also called "sidewall") on the side of the source electrode SE of the trench T, and a channel resistance Rad which is a MIS channel resistance generated along the side surface of the trench T on the side of the drain electrode DE.

The two-dimensional electron gas 2DEG is formed by the following mechanism. Nitride semiconductors (meaning, in this example, gallium nitride-based semiconductors) configuring the channel layer CH and the barrier layer BA are different from each other in forbidden band width (band gap) or electron affinity. A well type potential is therefore formed at a junction plane of these semiconductors. When electrons are accumulated in this well-type potential, a two-dimensional electron gas 2DEG is formed in the vicinity of the interface between the channel layer CH and the barrier layer BA.

The two-dimensional electron gas 2DEG formed in the vicinity of the interface between the channel layer CH and the barrier layer BA is separated by the trench T having the gate electrode GE therein. In the semiconductor device of the present embodiment, therefore, an off state can be maintained when a positive electric potential (threshold potential) is not applied to the gate electrode GE and an on state can be maintained when a positive electric potential (threshold potential) is applied to the gate electrode GE. Thus, a normally-off operation can be performed.

The configuration of the semiconductor device of the present embodiment will next be described more specifically. As shown in FIG. 1, in the semiconductor device of the present embodiment, a substrate S has thereon a nucleus forming layer NUC and the nucleus forming layer NUC has thereon a strain relaxing layer STR. The nucleus forming layer NUC is formed to generate crystal nuclei necessary for the growth of a layer to be formed on the nucleus forming layer such as the strain relaxing layer STR. It is also formed to prevent the substrate S from undergoing a quality change which will otherwise occur by the diffusion of a constituent element (such as Ga) of the layer formed thereon. The strain relaxing layer STR is formed to relax a stress to the substrate S to prevent warpage or cracks of the substrate S.

This strain relaxing layer STR has thereon a buffer layer BU. The buffer layer BU has thereon a channel layer (also called "electron transit layer") CH made of a nitride semiconductor layer. The channel layer CH has thereon a barrier layer BA made of a nitride semiconductor. This means that the strain relaxing layer STR has, on the main surface (upper surface) thereof, the buffer layer BU, the channel layer CH, and the barrier layer BA formed (stacked) one after another in the order of mention. The barrier layer BA has thereon a source electrode SE and a drain electrode DE via an ohmic layer. The buffer layer BU is an intermediate layer located between the channel layer CH and the strain relaxing layer STR.

The gate electrode GE is formed, via a gate insulating film GI, inside a trench (also called "trench" or "recess") T that penetrates through an insulating film IF1 and the barrier layer BA and reaches the inside of the channel layer CH.

The gate insulating film GI is made of a stacked film (which may also be called laminate film) of the insulating film IF1 and an insulating film IF2. The insulating film IF1 has an opening portion in an opening region OA1. This opening portion is provided in a region wider, on the side of the drain electrode DE, by a distance Ld than the formation region (opening region OA2) of the trench T. In other words, the insulating film IF1 is caused to retreat by the distance Ld from the end portion of the trench T on the side of the drain Electrode DE. This distance Ld is sometimes called "retreat amount Ld".

As described above, the insulating film IF1 is placed so as to cause it to retreat by the distance Ld from the end portion of the trench T on the side of the drain electrode DE and the insulating film IF2 is placed above the insulating film IF1 including the inside the trench T. As a result, the thickness of the gate insulating film GI made of a stacked film of the insulating film IF1 and the insulating film IF2 becomes a film thickness T1 corresponding to the thickness of the insulating film IF2 at the end portion of the trench T on the side of the drain electrode DE and from the position exceeding the retreat amount Ld on the side of the drain electrode DE, it becomes a film thickness T2 (>T1) corresponding to the sum of the thicknesses of the insulating film IF1 and the insulating film IF2.

In other words, the gate insulating film GI has, from the end portion of the trench T on the side of the drain electrode DE to the drain electrode DE, a first portion made of a single layer film of the insulating film IF2 and a second portion located on the side of the drain electrode DE relative to the first portion and made of a stacked film of the insulating film IF1 and the insulating film IF2. The distance from the end portion of the trench T on the side of the drain electrode DE to the second portion (the end portion of the insulating film IF2 on the side of the trench T) corresponds to the distance Ld.

The gate insulating film GI made of a stacked film of the insulating film IF1 and the insulating film IF2 has thereon the gate electrode GE. This gate electrode GE has an overhang in one direction (right side, that is, the side of the drain electrode in FIG. 1). This overhang is called "field plate electrode (also called "field plate electrode portion") FP. This field plate electrode FP is a region of a portion of the gate electrode GE extending from the end portion of the trench T on the side of the drain electrode DE to the side of the drain electrode DE.

The gate electrode GE (field plate electrode FP) is located on the first portion made of the single layer film of the insulating film IF2 and is also located on the second portion located on the side of the drain electrode DE relative to the first portion and made of a stacked film of the insulating film IF1 and the insulating film IF2. In other words, the field plate electrode FP has therebelow the first portion made of a single layer film of the insulating film IF2 and the second portion located on the side of the drain electrode DE relative to the first portion and made of a stacked film of the insulating film IF1 and the insulating film IF2.

As described above, on the gate insulating film GI made of the first portion located at the end portion of the trench T on the side of the drain electrode DE and the second portion located on the side of the drain electrode DE relative to the first portion and having a film thickness greater than that of the first portion, the gate electrode GE including the field plate electrode FP is placed. Such a structure reduces the thickness (T1) of the gate insulating film GI at the end portion of the trench T on the side of the drain electrode DE so that gate modulation becomes effective at the drain electrode DE side bottom portion and side surface of the trench T in which a channel C is to be formed. This means that such a structure facilitates formation of the channel C. As a result, a channel resistance Rad generated along the side surface of the trench T on the side of the drain electrode DE can be reduced.

By providing the first portion and the second portion, as described later in detail, the electric field concentrated site below the field plate electrode FP is dispersed into two sites (refer to FIG. 18). Such dispersion relaxes the electric field concentration and improves a gate breakdown voltage. Further, it reduces the length of the field plate electrode FP and therefore reduces the distance between the gate electrode GE and the drain electrode DE. A downsized or highly-integrated semiconductor device can therefore be obtained.

The barrier layer BA on both sides of this gate electrode GE has thereon a source electrode SE and a drain electrode DE. Compared with the distance between the end portion of the trench T and the source electrode SE, the distance between the end portion of the trench T to the drain electrode DE is greater. The source electrode SE and the drain electrode DE are coupled to the barrier layer BA via the opening portion of the insulating film IF1 and the insulating layer IL1. They are coupled by ohmic coupling.

The gate electrode GE has thereon the insulating layer IL1. The source electrode SE and the drain electrode DE are placed in and also on a contact hole formed in the insulating layer IL1. These insulating layer IL1, source electrode SE, and drain electrode DE have thereon an insulating layer IL2.

[Description on Manufacturing Method]

Referring to FIGS. 2 to 16, a method of manufacturing the semiconductor device of the present embodiment will hereinafter be described and the configuration of the semiconductor device will be shown more clearly. FIGS. 2 to 16 are cross-sectional views showing manufacturing steps of the semiconductor device of the present embodiment.

Figure 2:
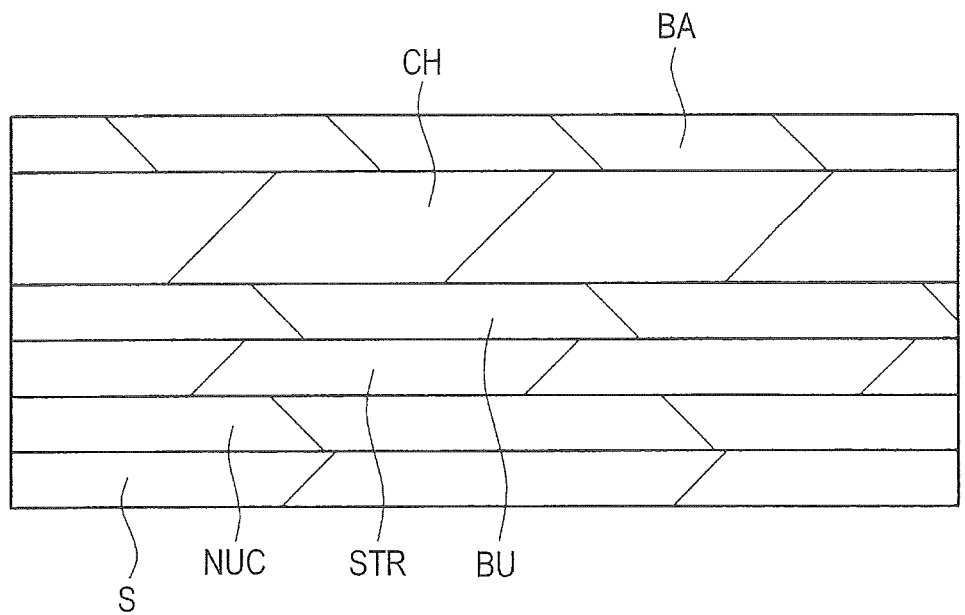
FIG. 2 is a cross-sectional view showing a manufacturing step of the semiconductor device of First Embodiment.

As shown in FIG. 2, a nucleus forming layer NUC, a strain relaxing layer STR, and a buffer layer BU are formed successively on a substrate S. For example, a semiconductor substrate made of silicon (Si) with the exposed (111) plane is used as the substrate S and on the substrate, hetero-epitaxial growth of, for example, an aluminum nitride (AlN) layer is performed using metal organic chemical vapor deposition (MOCVD) or the like method to form the nucleus forming layer NUC. Then, on the nucleus forming layer NUC, a superlattice structure is formed as the strain relaxing layer STR by repeating stacking of a stacked film (AlN/GaN film) of a gallium nitride (GaN) layer and an aluminum nitride (AlN) layer. For example, hetero-epitaxial growth of a gallium nitride (GaN) layer and an aluminum nitride (AlN) layer is repeated using metal organic chemical vapor deposition or the like method to form about 100 layers (200 layers in total), each having a film thickness of about from 2 to 3 nm. As the substrate S, a substrate made of SiC, sapphire, or the like may be used instead of the substrate made of silicon. All the group III nitride layers including the nucleus forming layer NUC and those formed after the nucleus forming layer NUC are ordinarily formed according to the group III element plane growth (meaning, in this case, a gallium plane growth or aluminum plane growth).

Next, a buffer layer BU is formed on the strain relaxing layer STR. For example, an AlGaN layer is formed as the buffer layer BU on the strain relaxing layer STR by hetero-epitaxial growth by using metal organic chemical vapor deposition or the like method.

Next, a channel layer CH is formed on the buffer layer EU. For example, a gallium nitride (GaN) layer is formed on the buffer layer BU by hetero-epitaxial growth by using metal organic chemical vapor deposition or the like method. The resulting channel layer CH has a film thickness of, for example, 3 nm or greater.

Next, for example, an AlGaN layer is formed as a barrier layer BA on the channel layer by hetero-epitaxial growth CH by using metal organic chemical vapor deposition or the like method. The composition ratio of Al in this AlGaN layer as the barrier layer BA is greater than the composition ratio of Al in the AlGaN layer as the buffer layer BU.

In such a manner, a stacked body of the buffer layer EU, the channel layer CH, and the barrier layer BA is formed. This stacked body is formed by the group III plane growth in which stacking is conducted in a [0001] crystal axis (C axis) direction. In other words, the above-mentioned stacked body is formed by (0001) Ga plane growth. In the vicinity of the interface of the stacked body between the channel layer CH and the barrier layer BA, a two-dimensional electron gas 2DEG is formed.

Figure 3:
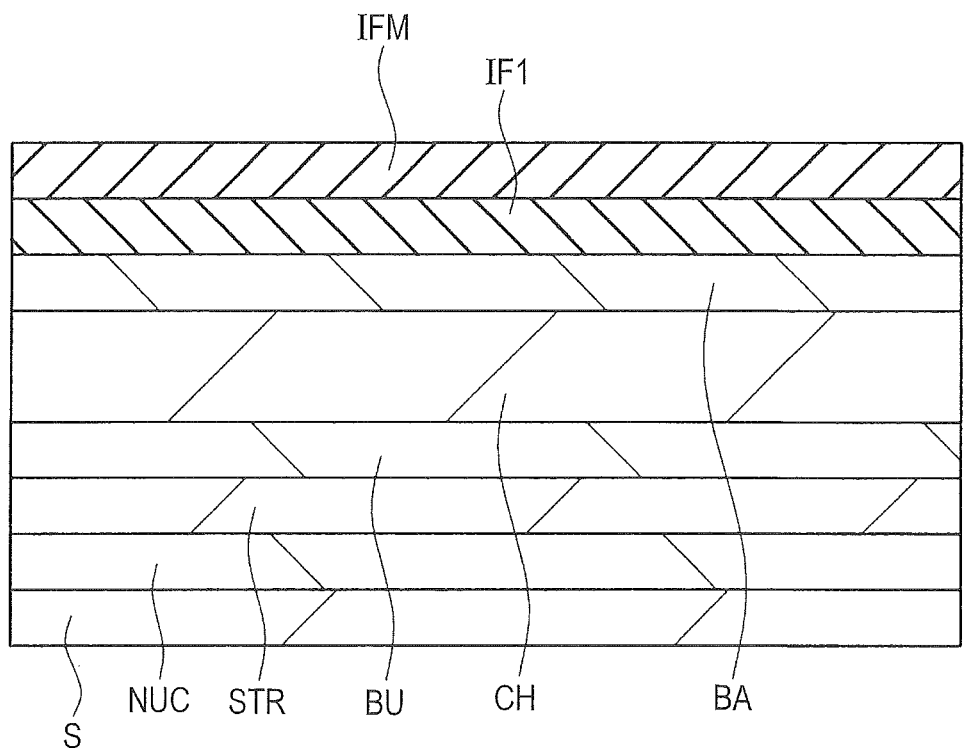
FIG. 3 is a cross-sectional view showing a manufacturing step of the semiconductor device of First Embodiment following the step shown in FIG. 2.

Next, as shown in FIG. 3, an insulating film IF1 as a cover film is formed on the barrier layer BA. Using a silicon nitride film as the cover film is preferred. This silicon nitride film is effective for suppressing a current collapse phenomenon in a GaN device. The silicon nitride film can be formed by CVD or ECR sputtering. ECR sputtering tends to use a complex device so that CVD is frequently used for mass production. As the insulating film IF1, for example, a silicon nitride film (silicon nitride-containing film) having a film thickness of about 900 angstrom ($1A=10^{-10}$ m) is deposited as the insulating film IF1 by using CVD (chemical vapor deposition) or the like method. Next, a silicon oxide film having a thickness of about 900 angstrom is deposited as a masking insulating film IFM on the insulating film IF1 by using CVD or the like method.

Figure 4:
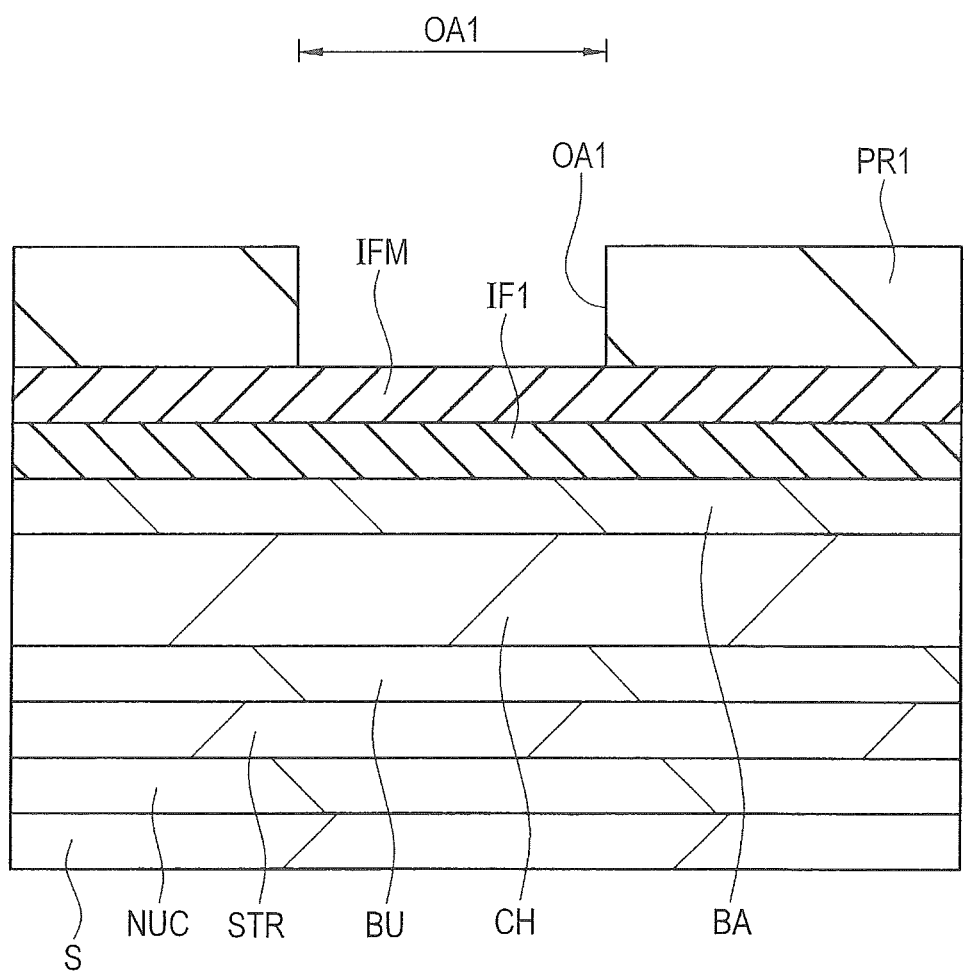
FIG. 4 is a cross-sectional view showing a manufacturing step of the semiconductor device of First Embodiment following the step shown in FIG. 3.
Figure 5:
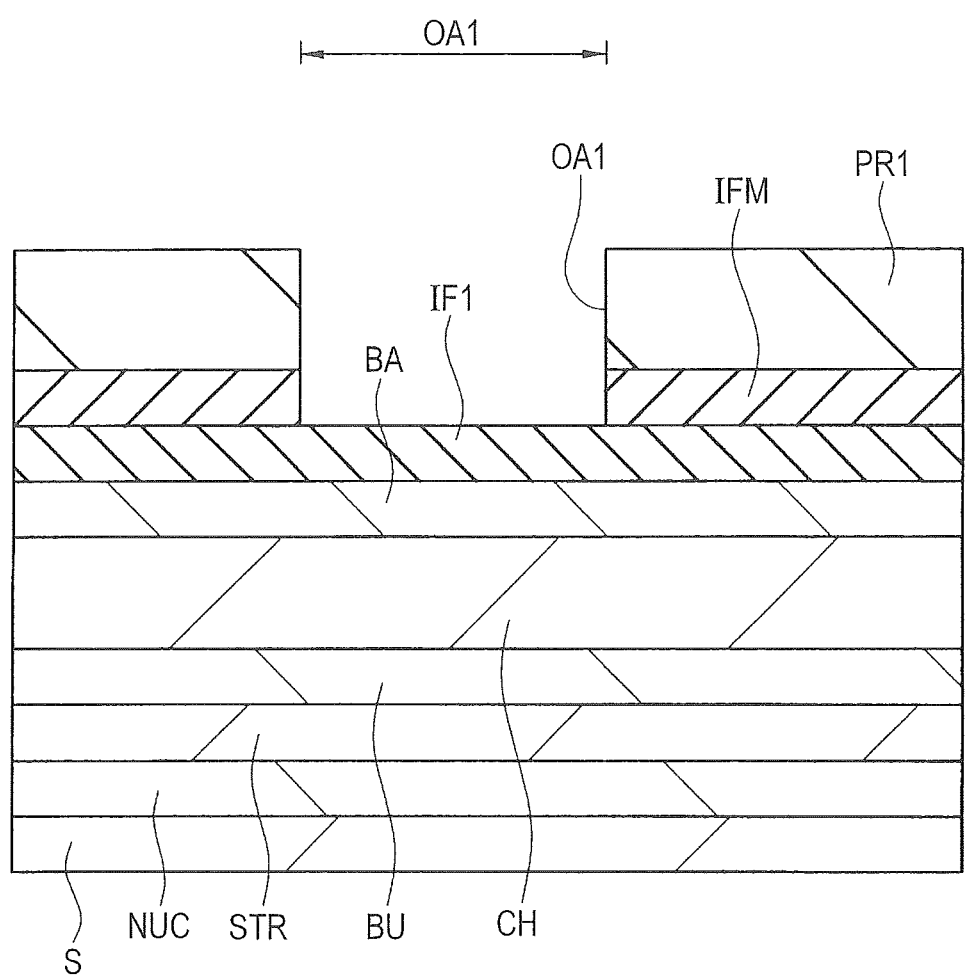
FIG. 5 is a cross-sectional view showing a manufacturing step of the semiconductor device of First Embodiment following the step shown in FIG. 4.
Figure 6:
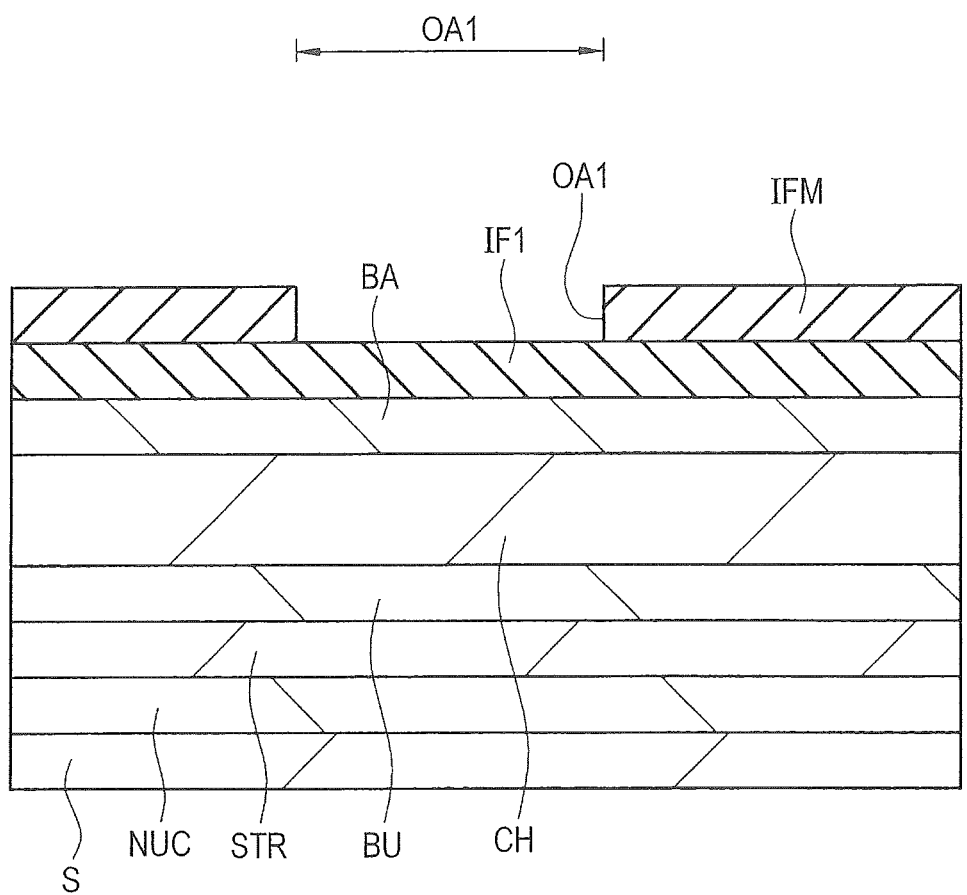
FIG. 6 is a cross-sectional view showing a manufacturing step of the semiconductor device of First Embodiment following the step shown in FIG. 5.

Next, as shown in FIG. 4, a photoresist film PR1 having, in an opening region OA1, an opening portion is formed by photolithography. Next, as shown in FIG. 5, with the photoresist film PR1 as a mask, the masking insulating film IFM is etched. For example, a hydrocarbon gas such as $C_4H_8$ can be used as an etching gas of the silicon oxide film. By this etching, the masking insulating film IFM having, in the opening range OA1, an opening portion is formed as shown in FIG. 5. Next, as shown in FIG. 6, plasma stripping treatment or the like is conducted to remove the photoresist film PR1.

Figure 7:
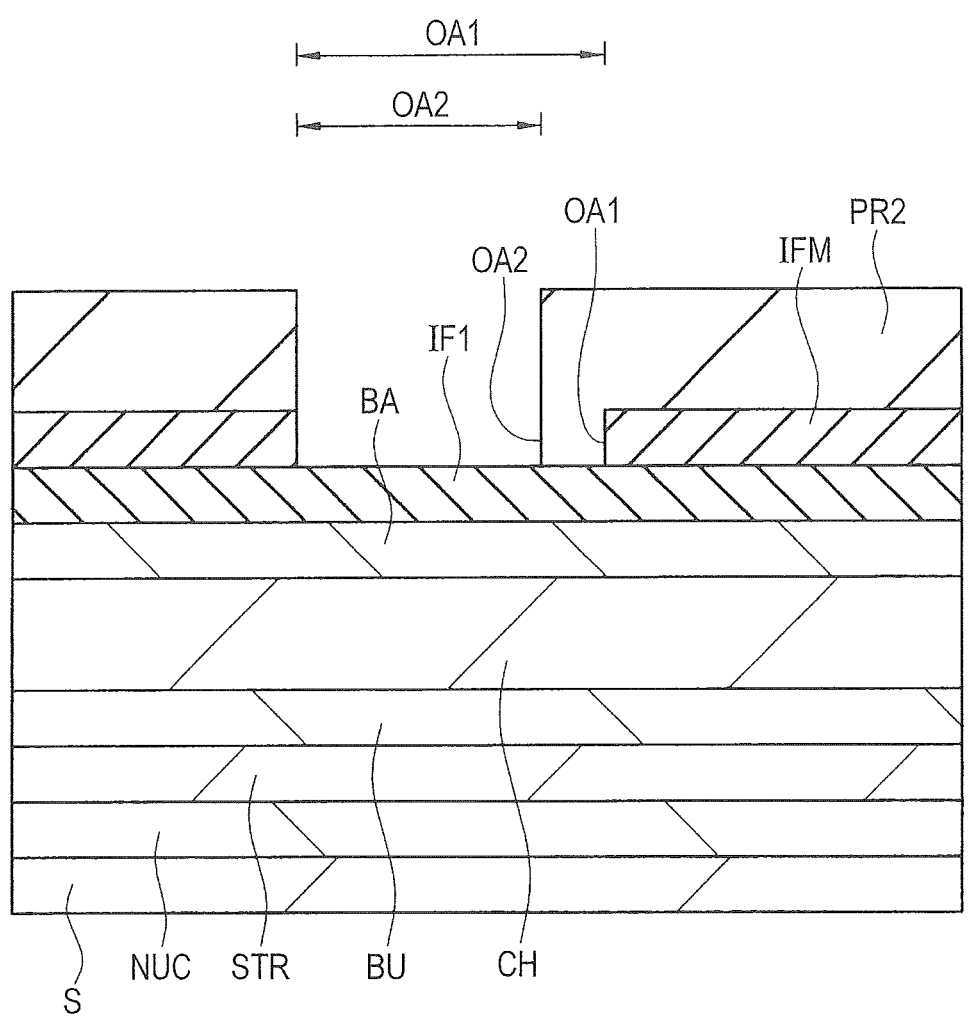
FIG. 7 is a cross-sectional view showing a manufacturing step of the semiconductor device of First Embodiment following the step shown in FIG. 6.
Figure 8:
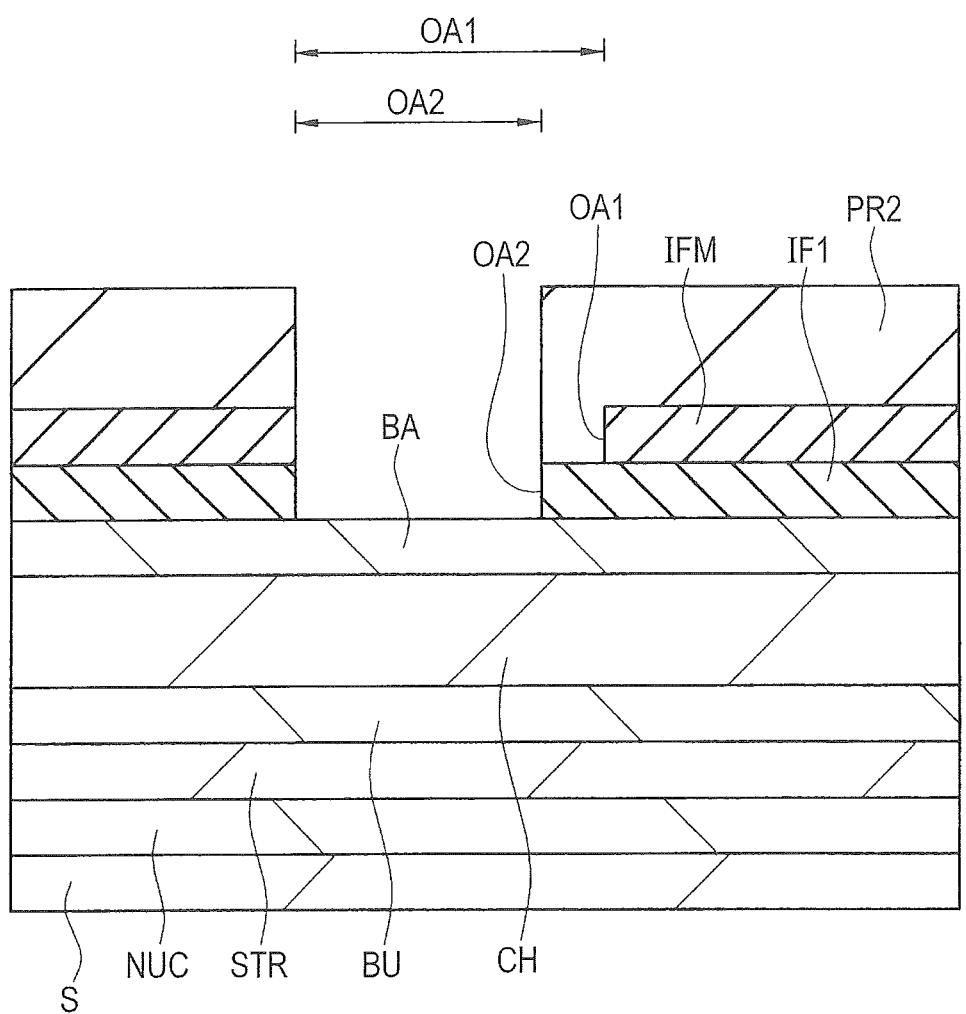
FIG. 8 is a cross-sectional view showing a manufacturing step of the semiconductor device of First Embodiment following the step shown in FIG. 7.

Next, as shown in FIG. 7, a photoresist film PR2 having an opening portion in an opening region OA2 located inside the opening region OA1 is formed using photolithography. Next, as shown in FIG. 8, with the photoresist film PR2 as a mask, the insulating film IF1 is etched. As an etching gas of the silicon nitride film, for example, a fluorine-based gas such as $SF_6$ or $CF_4$ can be used. Since the underlying barrier layer BA (AlGaN layer) is scarcely etched by the fluorine-based gas, the fluorine-based gas is suited as an etching gas of the masking insulating film IFM (silicon oxide film).

Figure 9:
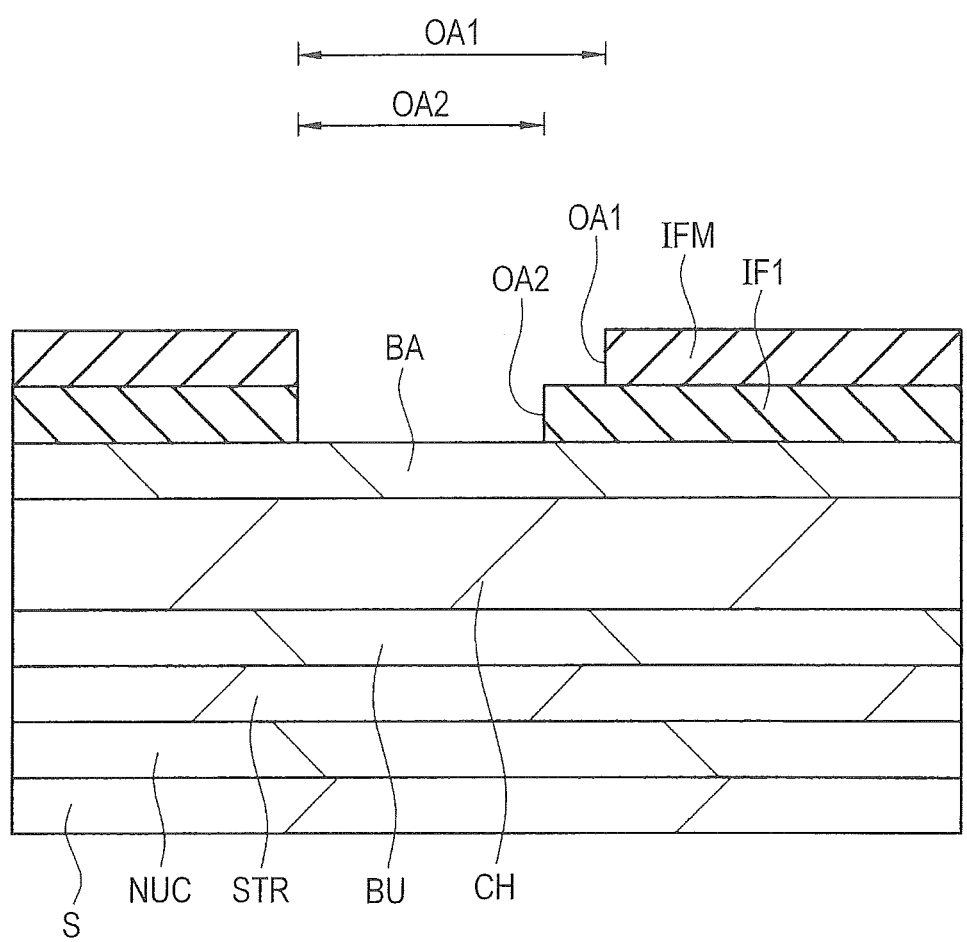
FIG. 9 is a cross-sectional view showing a manufacturing step of the semiconductor device of First Embodiment following the step shown in FIG. 8.

Next, the photoresist film PR2 is removed by plasma stripping treatment or the like. By this treatment, as shown in FIG. 9, the insulating film IF1 having an opening portion in the opening region OA2 is formed on the barrier layer BA. Further, the masking insulating film IFM caused to retreat from one end of the opening region OA2 and having an opening portion in the opening region OA1 is placed on this insulating film IF1. This insulating film IF1 becomes a part of the gate insulating film GI, while the insulating film IFM becomes a mask during etching for causing the insulating film IF1 to retreat from the end portion of the trench T which will be described later.

Figure 10:
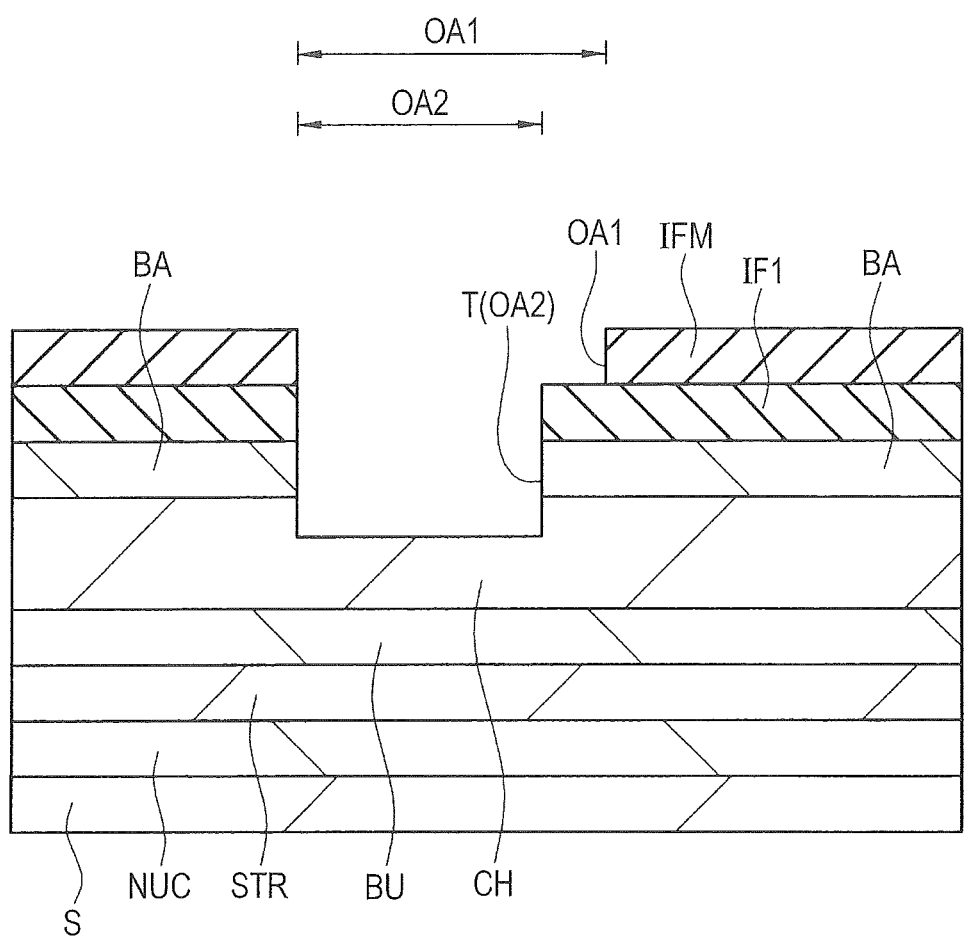
FIG. 10 is a cross-sectional view showing a manufacturing step of the semiconductor device of First Embodiment following the step shown in FIG. 9.

Next, as shown in FIG. 10, with the stacked film of the insulating film IF1 and the insulating film IFM as a mask, the barrier layer BA and the channel layer CH (also called "stacked body") is etched to form a trench T penetrating through the insulating film IF1 and the barrier layer BA and reaching the inside of the channel layer CH. As an etching gas, for example, a chlorine-based gas (such as $BCl_3$) is used. Although not clearly shown in FIG. 10, at the surface of the insulating film IFM or the exposed portion of the insulating film IF1, these films may be etched and become thinner during etching for forming the trench T. This etching may be followed by heat treatment (annealing) for recovering the etching damage.

Figure 11:
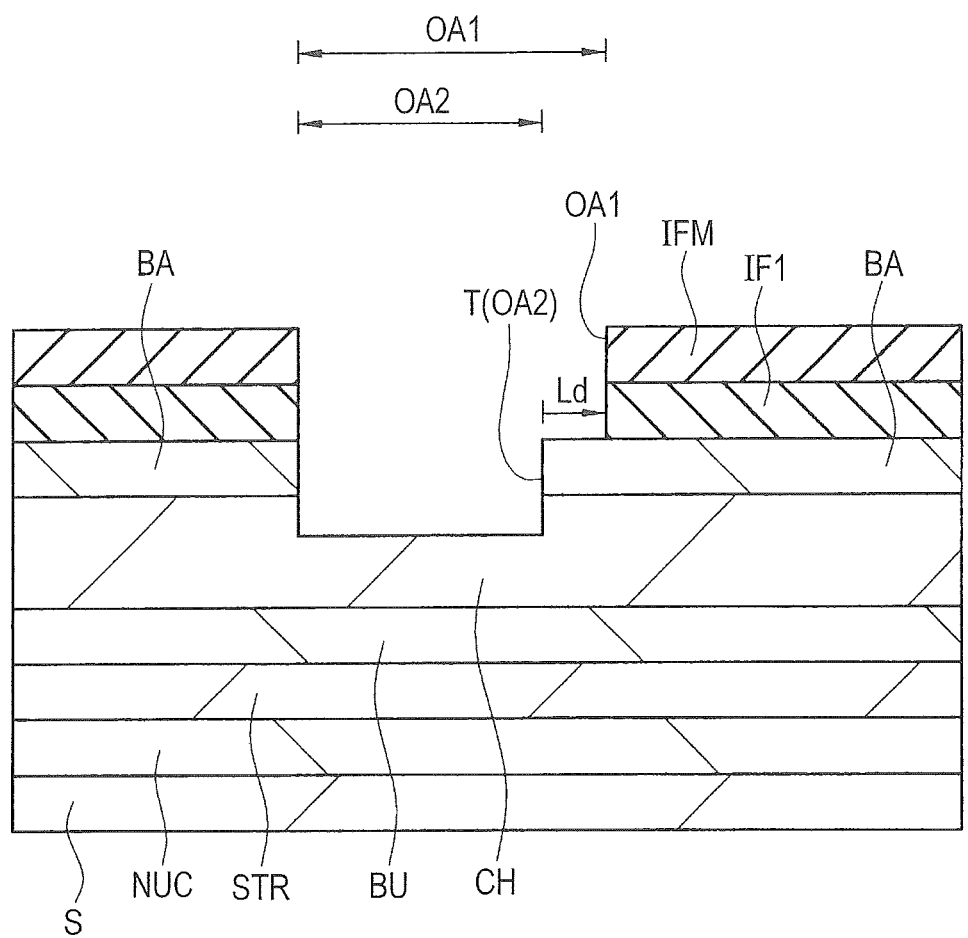
FIG. 11 is a cross-sectional view showing a manufacturing step of the semiconductor device of First Embodiment following the step shown in FIG. 10.
Figure 12:
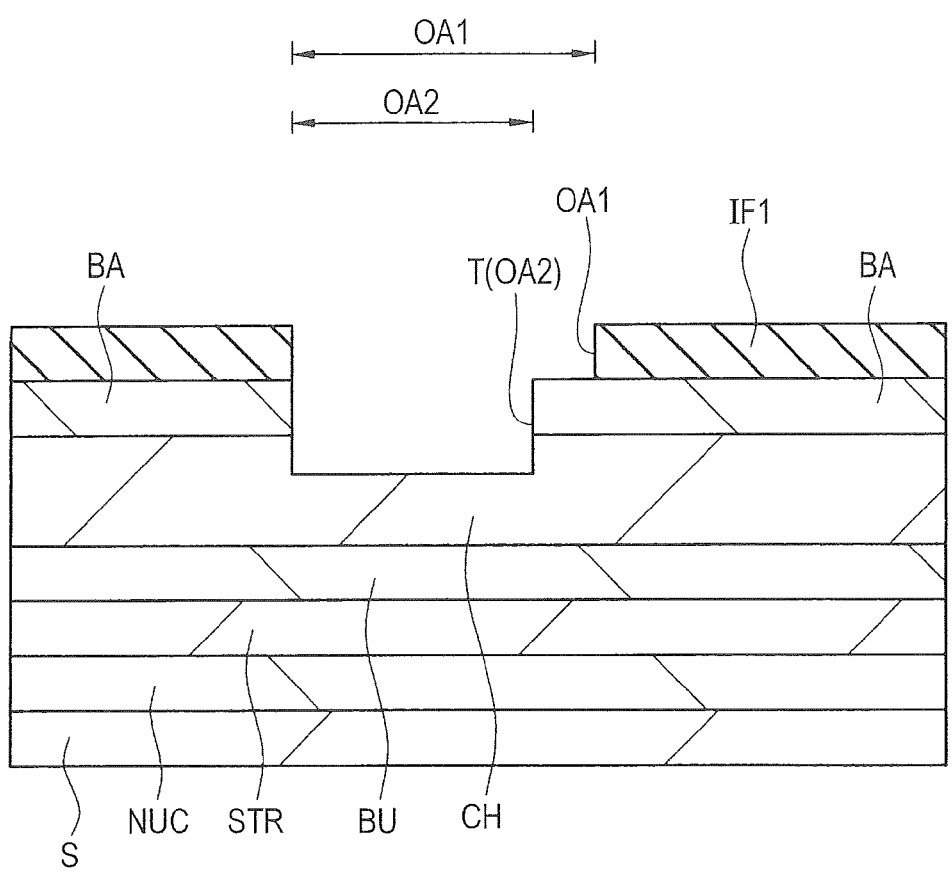
FIG. 12 is a cross-sectional view showing a manufacturing step of the semiconductor device of First Embodiment following the step shown in FIG. 11.

Next, as shown in FIG. 11, with the masking insulating film IFM as a mask, the insulating film IF1 is etched. By this etching, the end portion of the insulating film IF1 on the side of the trench T is caused to retreat in one direction (right side in FIG. 11). The retreat amount (retreat distance) will hereinafter be called "Ld". This retreat occurs in a direction to the side of the drain electrode DE which will be described later. Next, as shown in FIG. 12, the making insulating film IFM is removed by etching.

The remaining stacked film of the mask insulating film IFM and the insulating film IF1 corresponding to a predetermined thickness (film thickness of the exposed portion of the insulating film IF1) may be etched back to cause the end portion of the insulating film IF1 on the side of the trench T to retreat. During this etch back, an etching amount may be adjusted so as to completely remove the masking insulating film IFM. When the masking insulating film IFM remains, the remaining insulating film IFM may be removed by separate etching.

Figure 13:
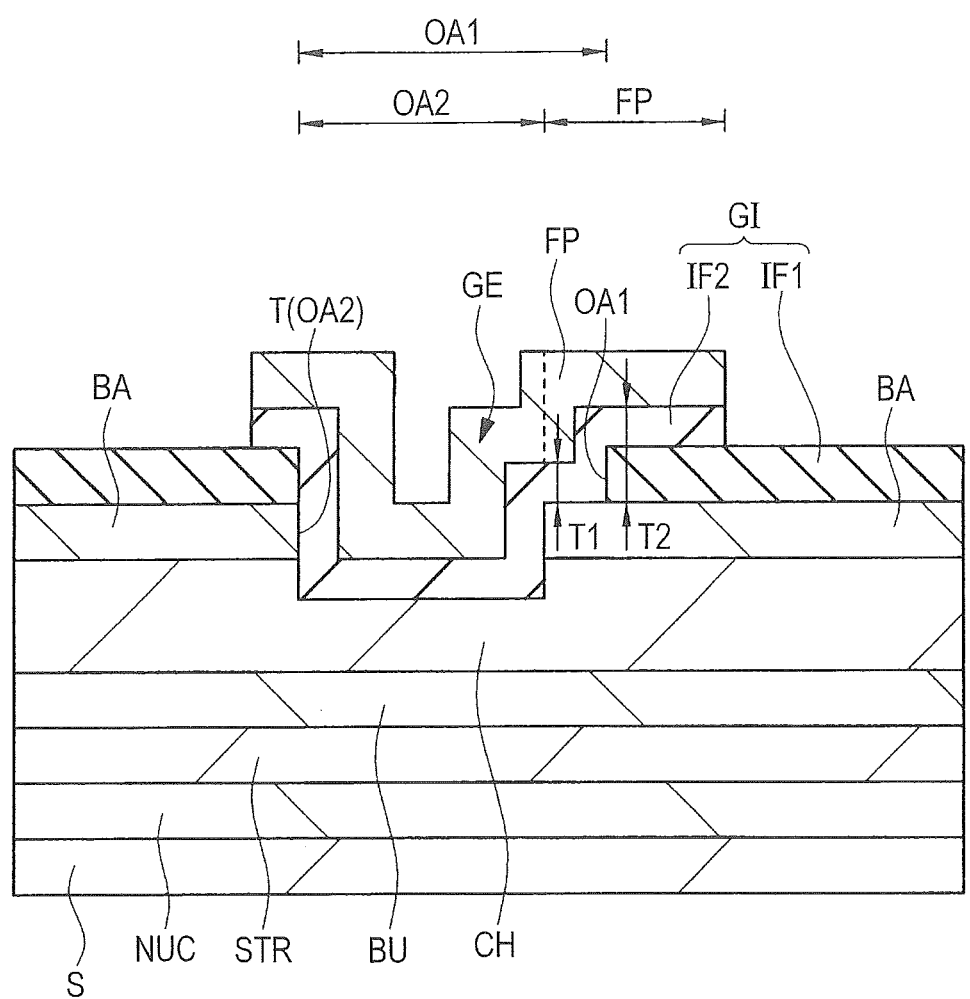
FIG. 13 is a cross-sectional view showing a manufacturing step of the semiconductor device of First Embodiment following the step shown in FIG. 12.

Next, as shown in FIG. 13, an insulating film IF2 is formed on the insulating film IF1 as well as in the trench T and on the exposed portion of the barrier layer BA. The insulating film IF1 and the insulating film IF2 function as a gate insulating film GI. This means that the insulating film GI contributing to gate modulation when a positive electric potential (threshold potential) is applied to the gate electrode GE is mainly a portion of the insulating film IF2.

For example, as the insulating film IF2, alumina (aluminum oxide film, $Al_2O_3$) is deposited on the insulating film IF1, in the trench T, and on the exposed portion of the barrier layer BA by using ALD (atomic layer deposition). As the insulating film IF2, as well as alumina (alumina-containing film), a silicon oxide film or a high dielectric constant film having a dielectric constant higher than that of a silicon oxide film may be used. As the high dielectric constant film, a hafnium oxide ($HfO_2$ film) may be used. As the high dielectric constant film, a hafnium-based insulating film such as hafnium aluminate film, HfON film (hafnium oxynitride, film), HfSiO film (hafnium silicate film), HfSiON film (hafnium silicon oxynitride film), or HfAlO film may be used instead.

In such a manner, the gate insulating film GI is comprised of a stacked film of the insulating film IF1 and the insulating film IF2 as described above. As a result, the trench T has, on the side of the sidewall thereof, a first film thickness portion made of a single layer film of the insulating film IF2. On the side of the drain electrode DE which will be described later, a second film thickness portion comprised of a stacked film of the insulating film IF1 and the insulating film IF2 is provided. The thickness T2 of the second film thickness portion is greater than the film thickness T1 of the first film thickness portion (refer to FIG. 13).

Next, a gate electrode GE is formed on the gate insulating film GI inside the trench T. For example, on the gate insulating film GI, a stacked film (which may also be called "Au/Ni film") made of, for example, a nickel (Ni) film and a gold (Au) film lying thereon is deposited as a conductive film by sputtering or the like method. Next, photolithography and etching are used to pattern the Au/Ni film and thereby form a gate electrode GE. During etching of this Au/Ni film, the insulating film IF2 therebelow may be etched.

During this patterning, the gate electrode GE is patterned to have an overhang in one direction (the right side, that is, the side of the drain electrode DE in FIG. 13). In other words, patterning is carried out to provide a field plate electrode (which may also be called "field plate electrode portion") FP as a part of the gate electrode GE. The field plate electrode FP is a partial region of the gate electrode GE and it is an electrode portion extending to the side of the drain electrode DE from the end portion of the trench T on the side of the drain electrode DE.

This means that the field plate electrode FP is placed so as to cover the upper part of the first film thickness portion made of a single layer film of the insulating film IF2 and the upper part of the second film thickness portion located on the side of the drain electrode DE relative to the first film thickness portion and made of a stacked film of the insulating film IF1 and the insulating film IF2.

Figure 14:
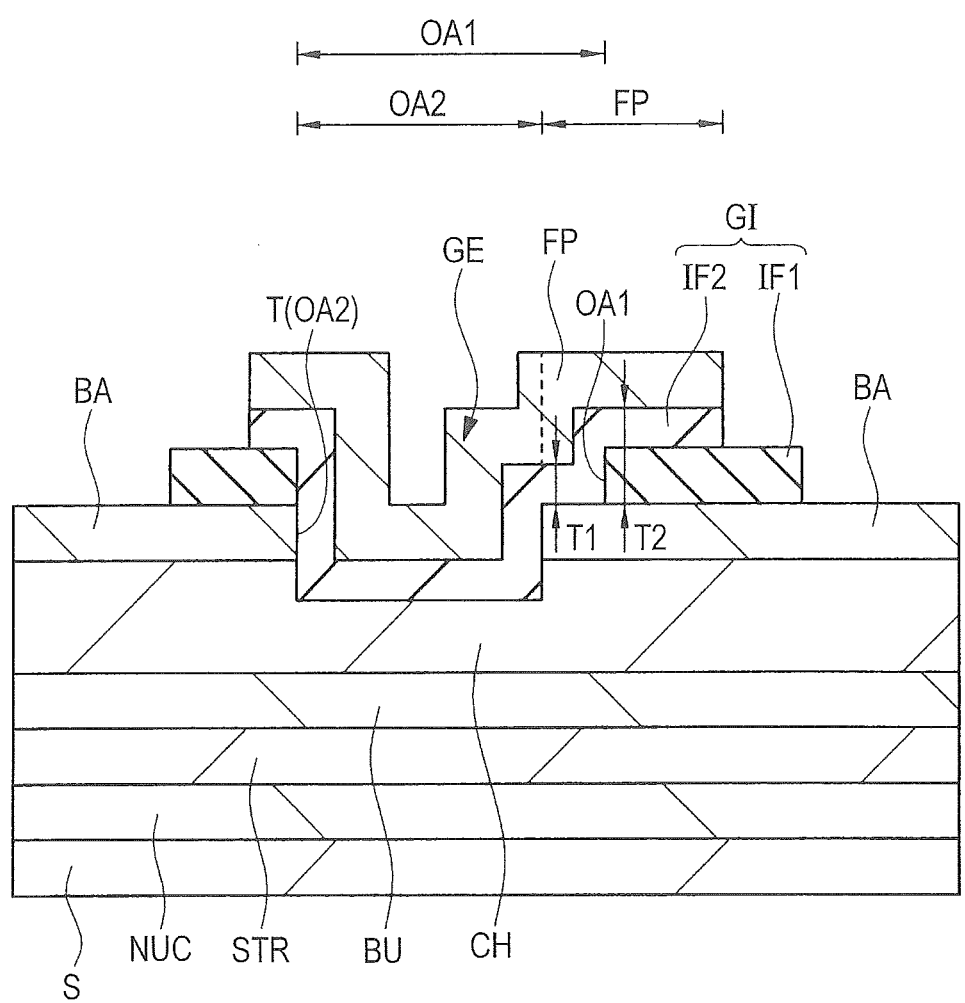
FIG. 14 is a cross-sectional view showing a manufacturing step of the semiconductor device of First Embodiment following the step shown in FIG. 13.

Next, as shown in FIG. 14, the insulating film IF1 is removed from the formation regions of the source electrode SE and the drain electrode DE which will be described later. By patterning the insulating film IF1 by using photolithography and etching, the barrier layer BA in the formation regions of the source electrode SE and the drain electrode DE is exposed. Alternatively, this removal of the insulating film IF1 may be performed at the time of forming a contact hole C1 which will be described later.

Figure 15:
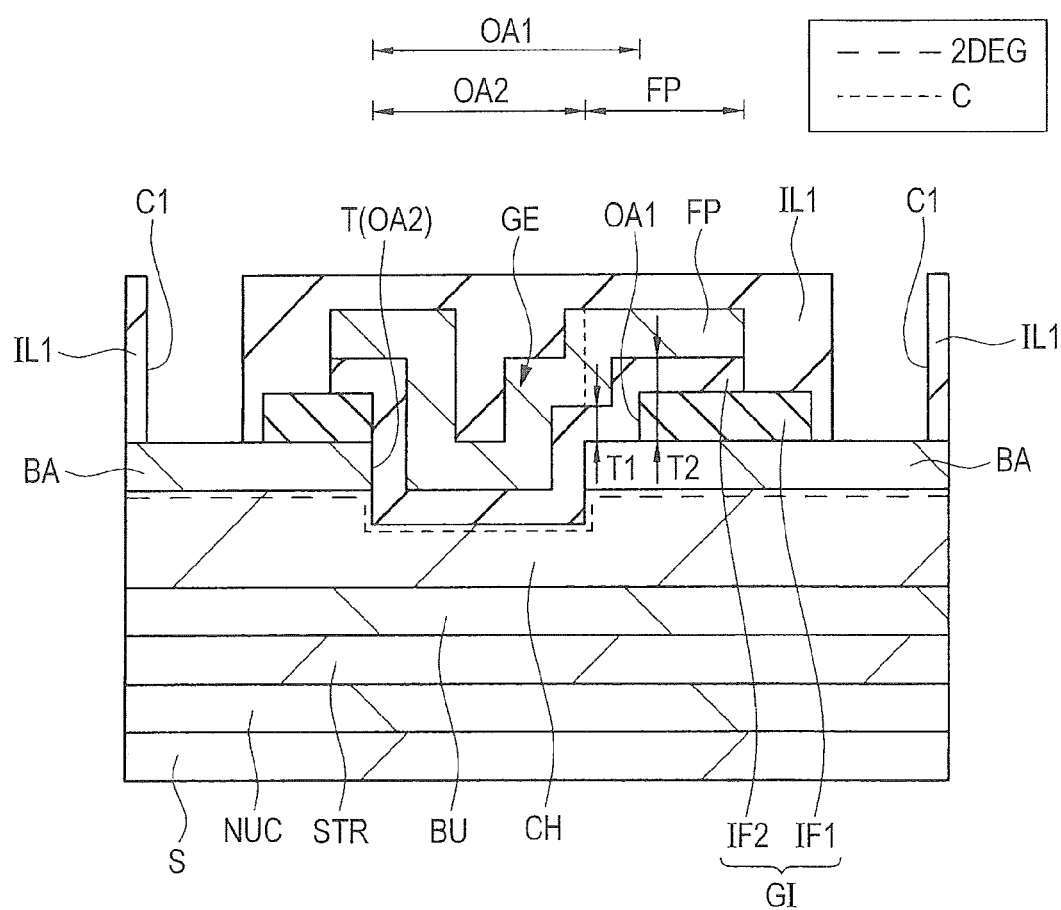
FIG. 15 is a cross-sectional view showing a manufacturing step of the semiconductor device of First Embodiment following the step shown in FIG. 14.

Next, as shown in FIG. 15, an insulating layer IL1 is formed on the gate electrode GE. As the insulating layer IL1, for example, a silicon oxide film is formed using CVD or the like on the gate electrode GE, the insulating film IF1, and the barrier layer BA. Then, a contact hole C1 is formed in the insulating layer IL1 by using photolithography and etching. This contact hole C1 is placed on the barrier layer BA on both sides of the gate electrode GE.

Figure 16:
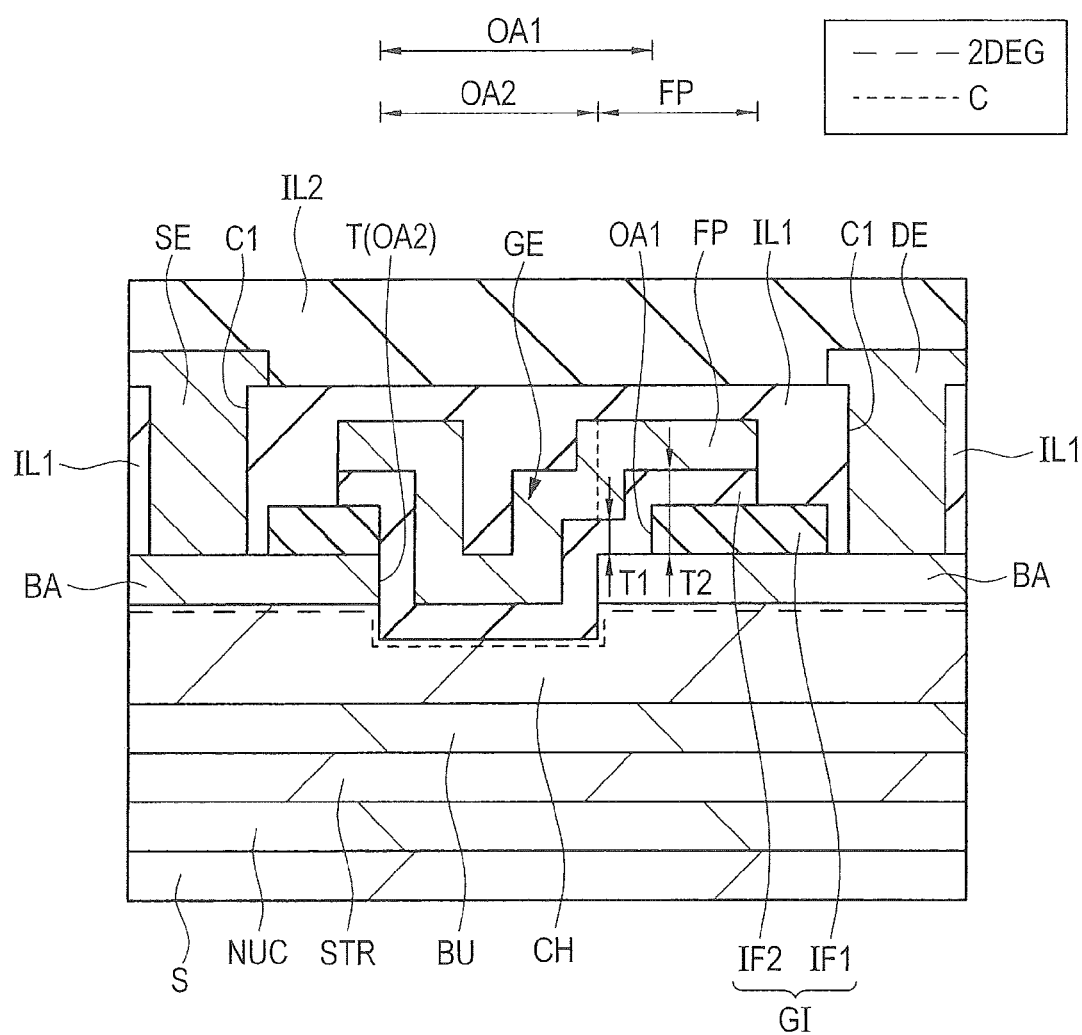
FIG. 16 is a cross-sectional view showing a manufacturing step of the semiconductor device of First Embodiment following the step shown in FIG. 15.

Next, as shown in FIG. 16, an ohmic layer (not illustrated) is formed on the insulating layer IL1 including the inside of the contact hole C1. For example, a stacked film (which may also be called "Al/Ti film") made of a titanium (Ti) film and an aluminum (Al) film lying thereon is deposited both on the insulating layer IL1 including the inside of the contact hole C1 by using vapor deposition or the like. Further, for example, a stacked film (which may also be called "TiN/Ti film") made of a titanium (Ti) film and a titanium nitride film (TiN) lying thereon is deposited on the Al/Ti film by using sputtering or the like. As a result, a stacked film (which may also be called "TiN/Ti/Al/Ti film") made of a titanium (Ti) film, an aluminum (Al) film, a titanium (Ti) film, and a titanium nitride (TiN) film is formed. Then, heat treatment is performed, for example, at 550° C. for about 30 minutes. By this heat treatment, contact at the interface between the TiN/Ti/Al/Ti film and the GaN based semiconductor (ohmic layer not illustrated) becomes an ohmic contact. Then, an aluminum alloy film is deposited on the TiN/Ti/Al/Ti film (ohmic layer, not illustrated) by using sputtering or the like. As the aluminum alloy, for example, an alloy (Al—Si) of Al and Si, an alloy (Al—Cu) of Al and Cu (copper), an alloy (Al—Si—Cu) of Al, Si, and Cu can be used. Next, the TiN/Ti/Al/Ti film and the aluminum alloy film are patterned using photolithography and etching to respectively form a source electrode SE and a drain electrode DE in the contact holes C1 via the ohmic layer (not illustrated).

Next, an insulating layer (which may also be called "cover film" or "surface protective film") IL2 is formed on the insulating layer IL1 and also on the source electrode and the drain electrode DE. As the insulating layer IL2, for example, a silicon oxynitride (SiON) film is deposited on the insulating layer IL1 and also on the source electrode SE and the drain electrode DE by using CVD or the like.

By the above-described steps, the semiconductor device as shown in FIG. 1 can be fabricated. The above-mentioned steps are only exemplary and the semiconductor device of the present embodiment may be manufactured through steps other than the above-mentioned ones.

According to the present embodiment, the insulating film IF1 of the gate insulating film GI, which is made of the insulating IF1 and the insulating film IF2, is caused to retreat by the distance Ld from the end portion of the trench T on the side of the drain electrode DE and moreover, the insulating film IF2 is placed on the insulating film IF1 including the inside the trench T so that the gate insulating film GI below the field plate electrode FP can have a stepped structure (two-stage structure). In other words, the field plate electrode FP has, therebelow, a first portion made of a single layer film of the insulating film IF2 and a second portion located on the side of the drain electrode DE relative to the first portion and made of a stacked film of the insulating film IF1 and the insulating film IF2.

In such a structure, as described above, the film thickness of the gate insulating film GI at the end portion of the trench T on the side of the drain electrode DE decreases (to the film thickness T1) so that gate modulation becomes effective at the drain electrode DE side bottom portion and side surface of the trench T in which a channel C is to be formed. This means that such a structure facilitates formation of the channel C. As a result, a channel resistance Rad generated along the side surface of the trench T on the side of the drain electrode DE can be reduced.

Since the first portion and the second portion are provided, the electric field concentrated sites below the field plate electrode FP is dispersed in two sites as will be described in detail later (refer to FIG. 18). This dispersion leads to relaxation of electric field concentration and improvement in gate breakdown voltage. Further, this makes it possible to reduce the length of the field plate electrode FP and therefore reduce the distance between the gate electrode GE and the drain electrode DE. A downsized or highly-integrated semiconductor device can therefore be obtained.

Figure 17:
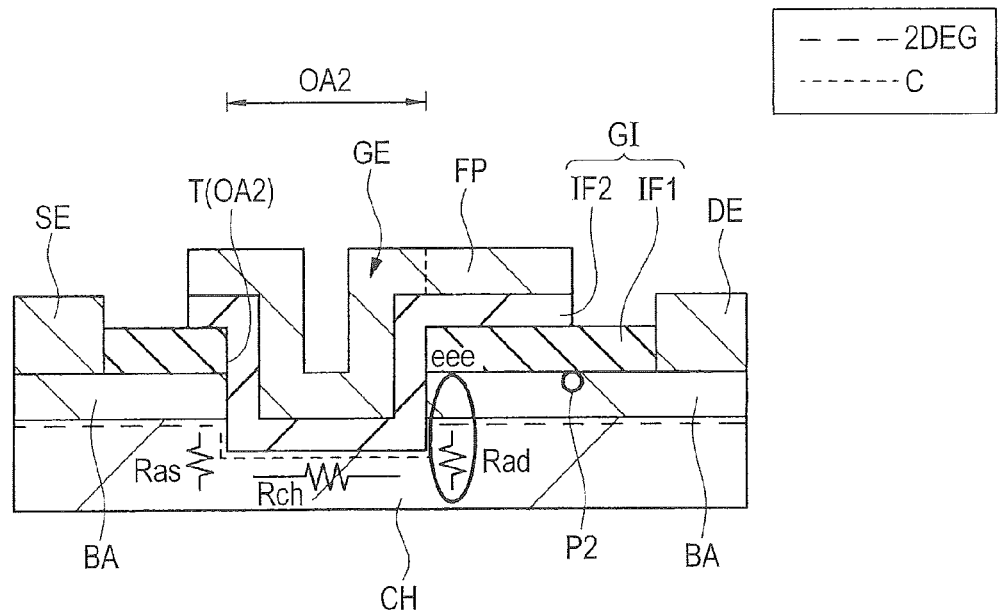
FIG. 17 is a cross-sectional view schematically showing the configuration of a semiconductor device of Comparative Example.

FIG. 17 is a cross-sectional view schematically showing the configuration of a semiconductor device of Comparative Example. FIG. 18 is a cross-sectional view schematically showing the configuration of the semiconductor device of the present embodiment in the vicinity of the gate electrode thereof.

In the semiconductor device of Comparative Example shown in FIG. 17, the end portion of the insulating film IF1 on the side of the trench T is not caused to retreat to the side of the drain electrode DE and the insulating film IF1 extends to the sidewall of the trench T. In this case, the thickness of the insulating film at the end portion of the trench T on the side of the drain electrode DE is a film thickness (T2) corresponding to the sum of the film thicknesses of the insulating film IF1 and the insulating film IF2. This means that the insulating film of this example is thicker (T2>T1) than that of the semiconductor device of the present embodiment shown in FIG. 18.

In the semiconductor device of Comparative Example shown in FIG. 17, channel resistance Rad generated along the side surface of the trench T on the side of the drain electrode DE may increase. During operation of the semiconductor device, the channel C formed along the side surface of the trench T on the side of the drain electrode DE shows a positive electric potential, influenced by a large positive drain voltage biased by the drain electrode DE. As described above, however, when the film thickness (T2) of the insulating film at the end portion of the trench T on the drain electrode DE is large, a distance between the field plate electrode FP of the gate electrode GE and the barrier layer BA (semiconductor region, nitride semiconductor region) increases and the channel C at the end portion of the trench T on the side of the drain electrode DE is not modulated sufficiently by a gate voltage. The channel C at the end portion of the trench T on the side of the drain electrode DE therefore has an effectively high threshold value Vth, inevitably leading to an increase in on resistance.

Further, an increase in on resistance occurs by channel narrowing. This means that a negative polarization charge (e) is generated on the surface of the AlGaN layer which is the barrier layer BA (refer to FIG. 17). The silicon nitride film (SiN film) used as the insulating film IF1 however cannot sufficiently compensate for the polarization charge (e) (refer to Non-patent Document 3 and the like). In particular, a silicon nitride film (SiN film) formed using thermal CVD or plasma CVD (Plasma-enhanced CVD) tends to have a Si-rich film composition. It has been revealed by the investigation by the present inventors that a Si-rich silicon nitride film is less effective for compensating for a negative polarization charge (e) on the surface of the AlGaN layer.

In the structure in which the channel portion at the end portion of the trench T on the side of the drain electrode DE is covered with a Si-rich silicon nitride film formed using thermal CVD or plasma CVD, therefore, channel narrowing is likely to occur at the channel C at the end portion of the trench T on the side of the drain electrode DE due to the influence of a negative polarization charge (e) which has remained without compensation. This channel narrowing leads to a further increase in the on resistance of the semiconductor device.

The polarization charge (e) on the uppermost surface of the barrier layer BA (semiconductor region, nitride semiconductor region) can be changed from negative to positive by covering the surface of the AlGaN layer, which is the barrier layer BA, with a cap layer made of GaN. The on-resistance increase problem due to channel narrowing can be overcome by the above-mentioned method. In the structure using the cap layer made of GaN, however, due to the influence of the negative polarization charge at the interface between the cap layer made of GaN and the barrier layer BA made of the AlGaN layer, the sheet charge density Ns of the channel C which is important inevitably decreases at the interface between the barrier layer BA made of the AlGaN layer and the channel layer CH made of GaN. It is thus difficult to suppress an increase in the on resistance even by using the cap layer made of GaN.

In the semiconductor device of Comparative Example shown in FIG. 17, electric field concentration occurs at the end portion (point P2) of the field plate electrode FP of the gate electrode GE on the side of the drain electrode DE during operation of the semiconductor device. Breakage is therefore likely to occur in the barrier layer BA (semiconductor region, nitride semiconductor region) just below the end portion (point P2) of the field plate electrode FP on the side of the drain DE.

In the semiconductor device of the present embodiment (FIG. 18), on the other hand, the end portion of the insulating film IF1 on the side of the trench T is caused to retreat to the side of the drain electrode DE so that film thickness (T1) of the insulating film decreases at the end portion of the trench T on the side of the drain electrode DE. This decreases a distance between the field plate electrode FP of the gate electrode GE and the semiconductor region (nitride semiconductor region) and increases gate-voltage-dependent modulation at the channel portion at the end portion of the trench T on the side of the drain electrode DE. This makes it possible to reduce the threshold value Vth of the channel portion at the end portion of the trench T on the side of the drain electrode DE and thereby reduce the on resistance.

Further, since the insulating film IF1 (silicon nitride film, SiN film) not capable of sufficiently compensating for the negative polarization charge (e) on the surface of the AlGaN layer which is the barrier layer BA is caused to retreat, the insulting film IF2 and the AlGaN layer serving as the barrier layer BA make contact with each other at the end portion of the trench T on the side of the drain electrode DE. In particular, by selecting, as the insulating film IF2, an insulating film material more effective in compensating for the negative polarization charge (e) than the insulating film IF1 (silicon nitride film, SiN film), channel narrowing can be suppressed. When alumina is used as the insulating film IF2, it can offset the negative polarization charge (e) at the interface between alumina and the AlGaN layer because it is more effective in compensating for the negative polarization charge (e) on the surface of the AlGaN layer than a silicon nitride film (refer to, for example, Non-patent Document 4). This therefore makes it possible to suppress generation of channel narrowing of the channel portion at the end portion of the trench T on the side of the drain electrode DE and thereby reduce the on resistance.

In the semiconductor device of the present embodiment (FIG. 18), the end portion of the insulating film IF1 on the side of the trench T is caused to retreat to the side of the drain electrode DE and the gate insulating film GI lying below the field plate electrode FP is equipped with a stepped structure (two-stage structure) so that electric field concentration is relaxed. Described specifically, as shown in FIG. 18, during operation of the semiconductor device, the electric field concentration is dispersed into two positions, that is, the end portion (point P1) of the insulating film IF1 on the side of the trench T and the end portion (point P2) of the field plate electrode FP of the gate electrode GE on the side of the drain electrode DE. The end portion (point P1) of the insulating film IF1 on the side of the trench T is a boundary between the first film thickness portion and the second film thickness portion. Due to the dispersion of the electric field concentrated position into two points, the electric field concentration is relaxed and a gate breakdown voltage increases (refer also to FIG. 36 of Second Embodiment). In addition, the length of the field plate electrode FP of the gate electrode GE or distance between the gate electrode GE and the drain electrode DE can be decreased. As a result, a downsized or highly-integrated semiconductor device can therefore be obtained.

Modification examples of the present embodiment will hereinafter be described.

MODIFICATION EXAMPLE 1

Figure 19:
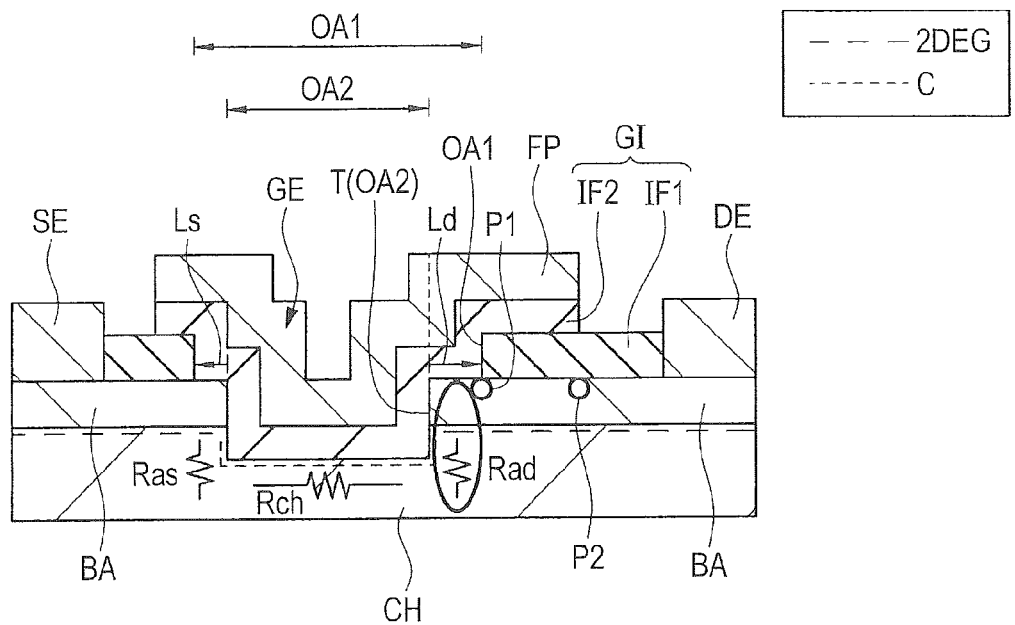
FIG. 19 is a cross-sectional view schematically showing the configuration of Modification Example 1 of the semiconductor device of First Embodiment.

In the above-described embodiment, the end portion of the insulating film IF1 on the side of the trench T is caused to retreat only to the side of the drain electrode DE. Alternatively, the end portions of the insulating film IF1 on the side of the trench T on the side of the drain electrode DE and on the side of the source electrode SE may be caused to retreat. FIG. 19 is a cross-sectional view schematically showing the configuration of Modification Example 1 of the semiconductor device of the present embodiment.

As shown in FIG. 19, the end portion of the insulating film IF1 on the side of the drain electrode DE is caused to retreat by a retreat amount Ld from the end portion of the trench T to the side of the drain electrode DE and further, the end portion of the insulating film IF1 on the side of the source electrode SE is caused to retreat by a retreat amount Ls from the end portion of the trench T to the side of the source electrode SE. In this case, even between the end portion of the trench T and the source electrode SE, the gate insulating film GI lying below the gate electrode GE has a stepped structure (two-stage structure). The other configuration is similar to that of the above embodiment so that a description on it is omitted. In a manufacturing method, a formation region of the opening region OA1 is formed by making it wider than the opening region OA2 by the distance Ls to the side of the source electrode SE and by the distance Ld to the side of the drain electrode DE. In such a manner, the opening region OA1 larger than the opening region OA2 is formed. A masking insulating film IFM having an opening portion in the opening region OA1 is formed and with this film as a mask, the insulating film IF1 is etched. The other steps are similar to those of the above embodiment so that a description on them is omitted.

MODIFICATION EXAMPLE 2

Figure 20:
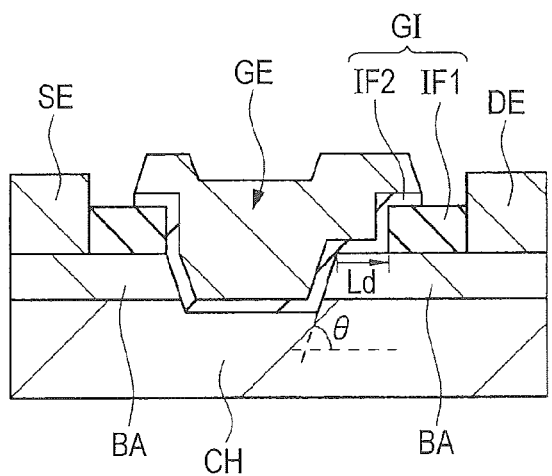
FIG. 20 is a cross-sectional view schematically showing the configuration of Modification Example 2 of the semiconductor device of First Embodiment.

In the above embodiment, the sidewall of the trench T is made substantially perpendicular (taper angle $\theta=90°$) to the surface of the barrier layer BA or the channel layer CH, but the sidewall of the trench T may be tapered. FIG. 20 is a cross-sectional view schematically showing the configuration of Modification Example 2 of the semiconductor device of the present embodiment.

As shown in FIG. 20, in this example, the angle (which may also be called "taper angle $\theta$") between the side surface (sidewall) of the trench T and the extension of the bottom surface of the trench T is less than 90°. In other words, the angle between the side surface (sidewall) of the trench T and the (111) plane is less than 90°. The other configuration is similar to that of the above embodiment so that a description on it is omitted. In the manufacturing method, etching conditions for the formation of the trench T are regulated so as to taper the sidewall of the trench T. For example, etching is conducted under the condition in which an isotropic etching gas component exceeds an anisotropic etching gas component. The other step is similar to that of the above embodiment so that a description on it is omitted.

(Second Embodiment)

Figure 21:
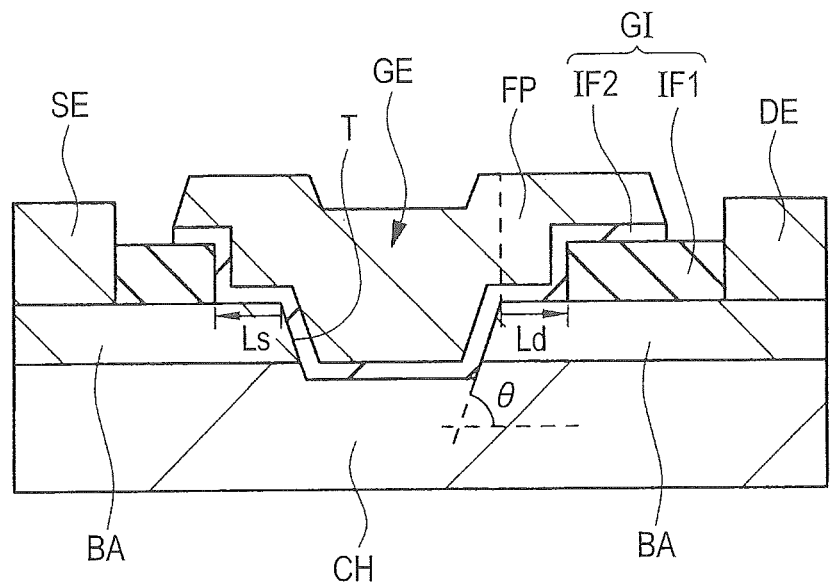
FIG. 21 is a cross-sectional view schematically showing the configuration of a semiconductor device of Second Embodiment.

In Modification Example 1 of First Embodiment, both the end portion of the insulating film IF1 on the side of the trench T on the side of the drain electrode DE and that on the side of the source electrode SE are caused to retreat, while in Modification Example 2, the sidewall of the trench T is tapered. It is also possible to taper the sidewall of the trench T while causing both the end portion of the insulating film IF1 on the side of the trench T on the side of the drain electrode DE and that on the side of the source electrode SE to retreat. FIG. 21 is a cross-sectional view schematically showing the configuration of a semiconductor device of the present embodiment.

[Description on Structure]

As shown in FIG. 21, in the semiconductor device of the present embodiment, the end portion of the insulating film IF1 on the side of the trench T on the side of the drain electrode DE is caused to retreat by a retreat amount Ld to the side of the drain electrode DE and the end portion of the insulating film IF1 on the side of the trench T on the side of the source electrode SE is caused to retreat by a retreat amount Ls to the side of the source electrode SE. Further, the angle $\theta$ between the side surface (sidewall) of the trench T and the extension of the bottom surface of the trench T is set at less than 90°. The other configuration is similar to that of First Embodiment so that a description on it is omitted.

[Description on Manufacturing Method]

Next, referring to FIGS. 22 to 30, a method of manufacturing the semiconductor device of the present embodiment will be described and at the same time, the configuration of this semiconductor device will be shown more clearly. FIGS. 22 to 30 are cross-sectional views showing the manufacturing steps of the semiconductor device of the present embodiment. A detailed description on steps similar to those of First Embodiment will be omitted.

Similar to First Embodiment, a stacked body of a nucleus forming layer NUC, a strain relaxing layer STR, a buffer layer BU, a channel layer CH, and a barrier layer BA is formed on a substrate S (refer to FIG. 2).

Figure 22:
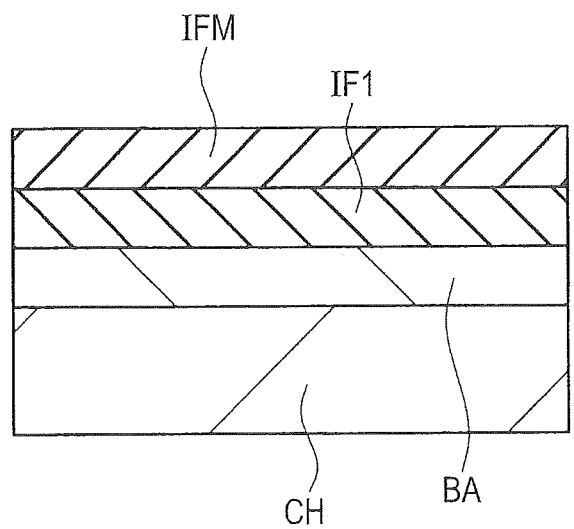
FIG. 22 is a cross-sectional view showing a manufacturing step of the semiconductor device of Second Embodiment.

Next, as shown in FIG. 22, an insulating film IF1 is formed as a cover film on the barrier layer BA. As the insulating film IF1, for example, a silicon nitride film having a thickness of about 900 angstrom is deposited using CVD or the like method. Next, a silicon oxide film having a thickness of about 900 angstrom is deposited as a masking insulating film IFM on the insulating film IF1 by using CVD or the like method.

Figure 23:
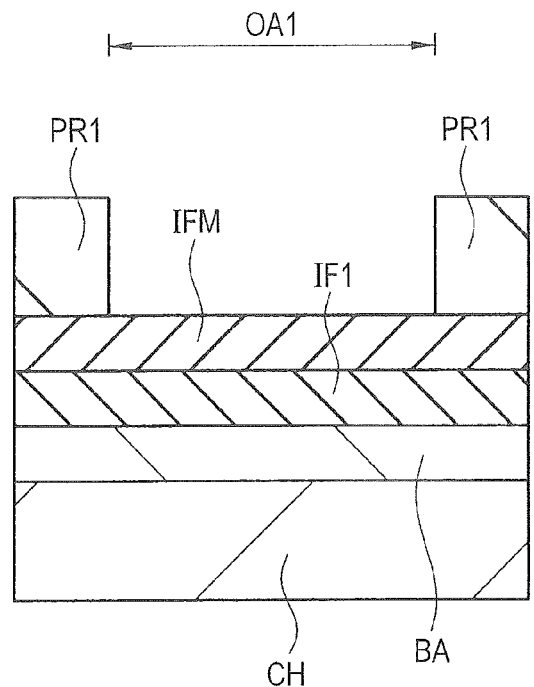
FIG. 23 is a cross-sectional view showing a manufacturing step of the semiconductor device of Second Embodiment following the step shown in FIG. 22.
Figure 24:
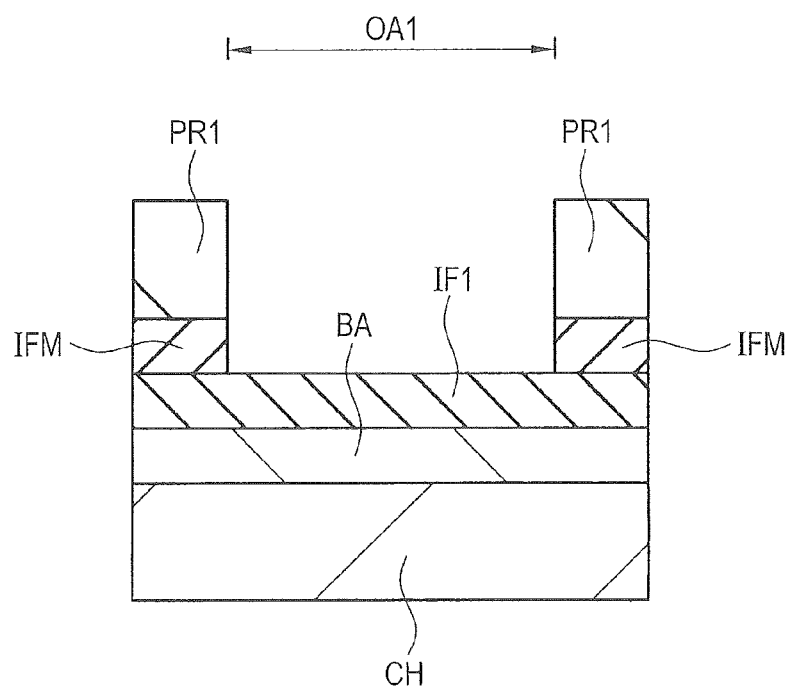
FIG. 24 is a cross-sectional view showing a manufacturing step of the semiconductor device of Second Embodiment following the step shown in FIG. 23.
Figure 25:
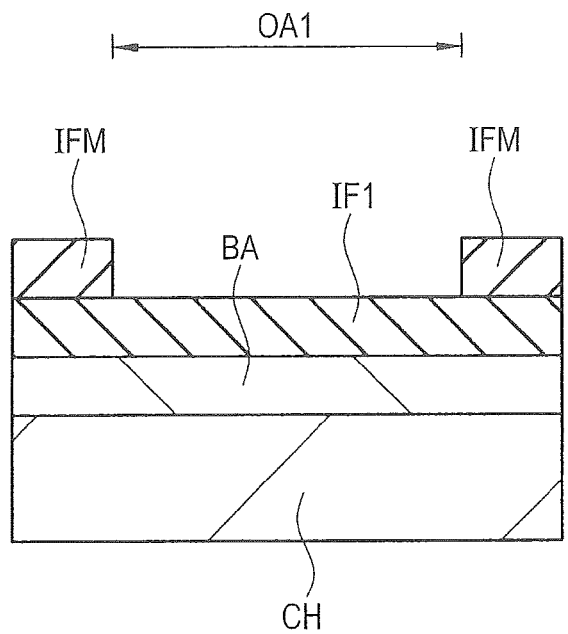
FIG. 25 is a cross-sectional view showing a manufacturing step of the semiconductor device of Second Embodiment following the step shown in FIG. 24.

Next, as shown in FIG. 23, a photoresist film PR1 having an opening portion in an opening region OA1 is formed using photolithography. The width of the opening is, for example, about 1.8 μm. Next, as shown in FIG. 24, with the photoresist film PR1 as a mask, the masking insulating film IFM is etched. As an etching gas of the silicon oxide film, for example, a hydrocarbon gas such as $C_4H_8$ can be used. Then, the photoresist film PR1 is removed using plasma stripping treatment or the like. As a result, as shown in FIG. 25, the masking insulating film IFM having an opening portion in the opening region OA1 is formed on the insulating film IF1.

Figure 26:
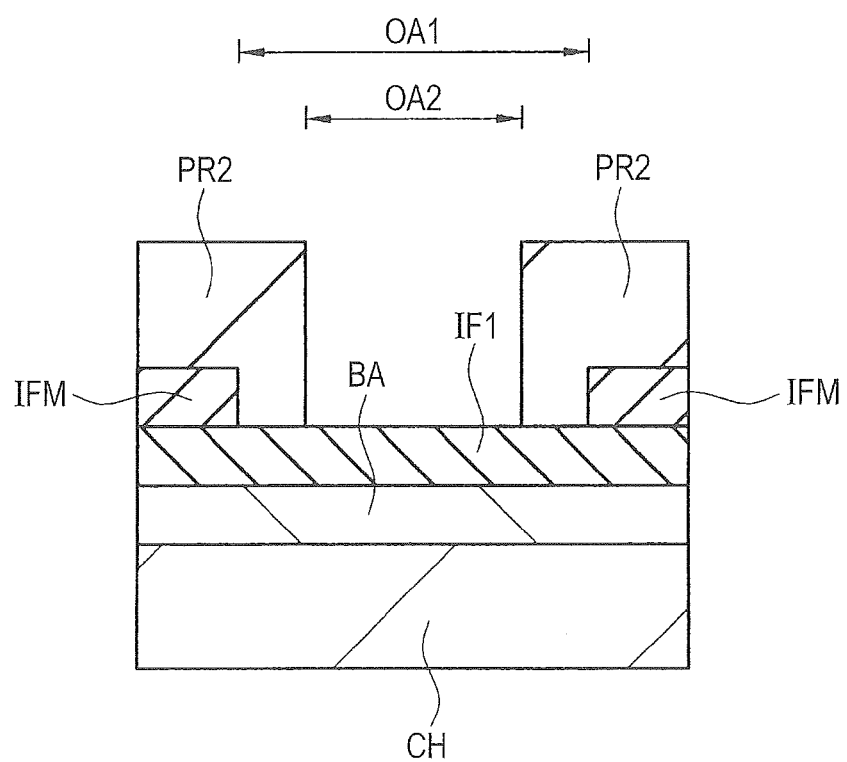
FIG. 26 is a cross-sectional view showing a manufacturing step of the semiconductor device of Second Embodiment following the step shown in FIG. 25.
Figure 27:
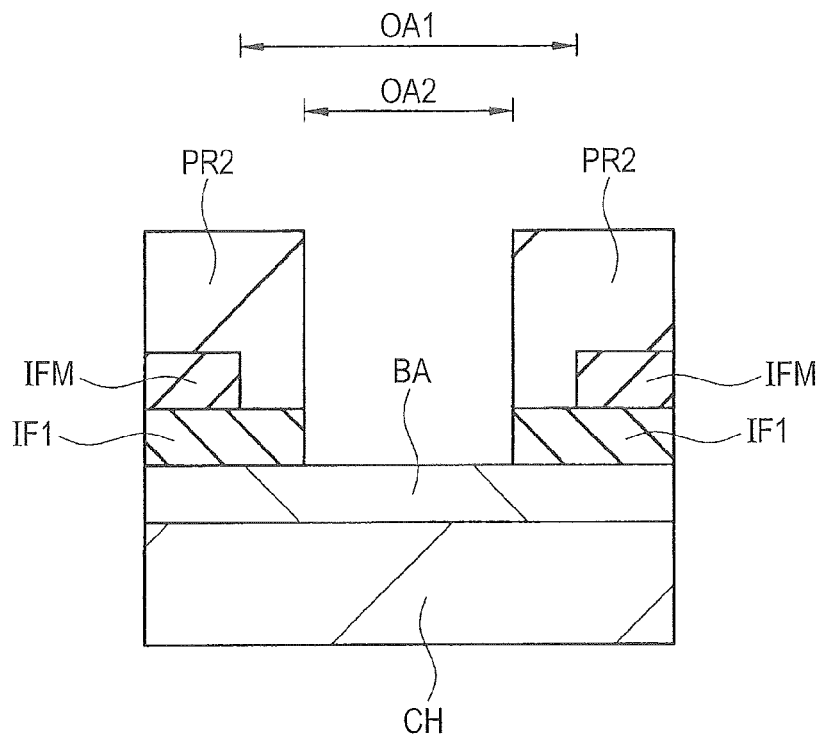
FIG. 27 is a cross-sectional view showing a manufacturing step of the semiconductor device of Second Embodiment following the step shown in FIG. 26.
Figure 28:
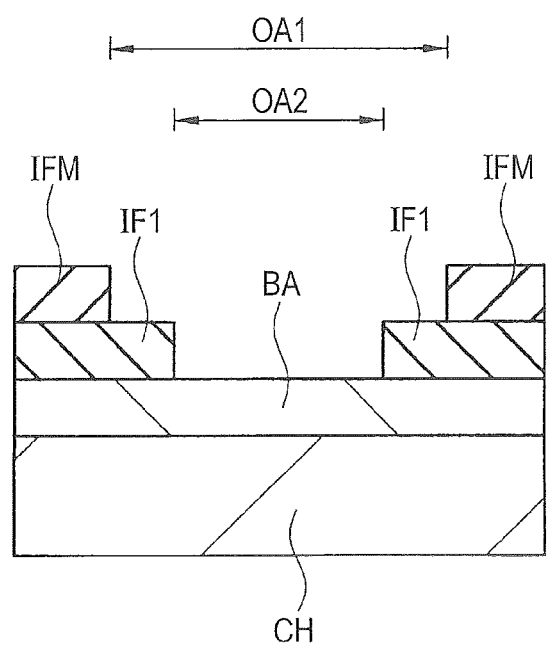
FIG. 28 is a cross-sectional view showing a manufacturing step of the semiconductor device of Second Embodiment following the step shown in FIG. 27.

Next, as shown in FIG. 26, a photoresist film PR2 having an opening portion in an opening region OA2 located inside the opening region OA1 is formed using photolithography. For example, the opening region OA2 is located at a substantially center portion of the opening region OA1 and it has an opening width of about 1 μm. Next, as shown in FIG. 27, with the photoresist film PR2 as a mask, the insulating film IF1 is etched. As an etching gas of the silicon nitride film, for example, a fluorine-based gas such as $SF_6$ or $CF_4$ can be used. The barrier layer BA (AlGaN layer) lying therebelow is scarcely etched with the fluorine-based gas so that using the fluorine-based gas as an etching gas of the insulating film IF1 (silicon nitride film) is suited. Next, the photoresist film PR2 is removed using plasma stripping treatment or the like. As a result, as shown in FIG. 28, the insulating film IF1 having an opening portion in the opening region OA2 is formed on the barrier layer BA. Further, on this insulating film IF1, the masking insulating film IFM caused to retreat from both ends of the opening region OA2 and having an opening portion in the opening region OA1 is placed. The insulating film IF1 becomes a part of the gate insulating film GI. The insulating film IFM becomes a mask upon etching for causing the insulating film IF1 to retreat from the end portion of the trench T which will be described later.

Figure 29:
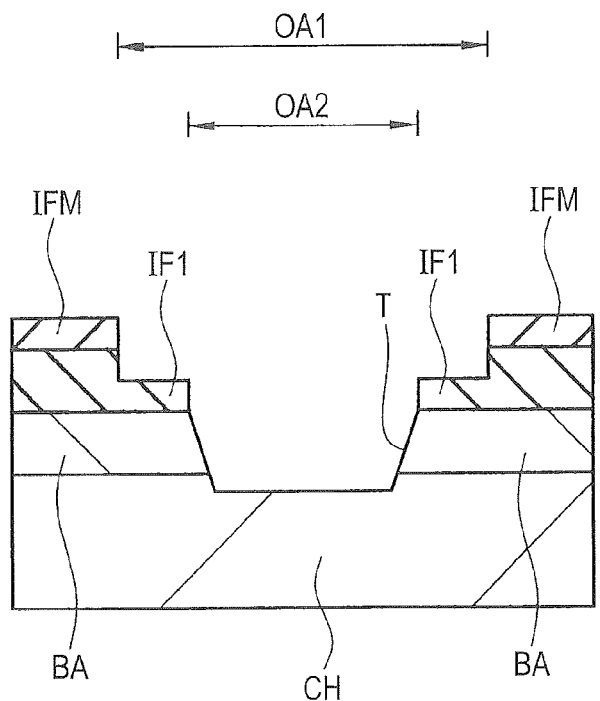
FIG. 29 is a cross-sectional view showing a manufacturing step of the semiconductor device of Second Embodiment following the step shown in FIG. 28.
Figure 30:
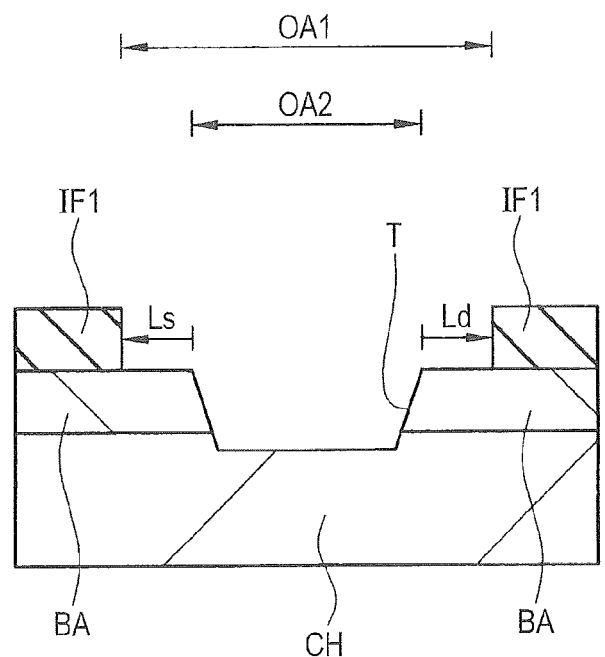
FIG. 30 is a cross-sectional view showing a manufacturing step of the semiconductor device of Second Embodiment following the step shown in FIG. 29.

Next, as shown in FIG. 29, with the insulating film IFM and the insulating film IF1 as a mask, the barrier layer BA and the channel layer CH are etched to form a trench T penetrating through the insulating film IF1 and the barrier layer B and reaching the inside of the channel layer CH. As an etching gas, for example, a chlorine-based gas such as $BCl_3$ can be used. The depth of the trench T, that is, the distance from the surface of the barrier layer BA to the bottom surface of the trench T is, for example, about 300 angstrom. The angle (taper angle $\theta$) between the sidewall of the trench T and the extension of the bottom surface of the trench T can be adjusted to about from 60 to 80° by using ordinary dry etching using $BCl_3$. With $BCl_3$, a predetermined thickness is etched from the surface of the insulating film IFM and the exposed portion of the insulating film IF1. The remaining thickness of the insulating film IFM is, for example, about 600 angstrom and the remaining thickness of the exposed portion of the insulating film IF1 is, for example, about 600 angstrom.

Next, a predetermined film thickness is etched back from the surface of the insulating film IFM and the exposed portion of the insulating film IF1 to remove the insulating film IFM and leave the insulating film IF1. The remaining film thickness of the insulating film IF1 at the exposed portion is, for example, about 80 nm. As a result, one end portion of the insulating film IF1 on the side of the trench T is retreated by a retreat amount Ld in one direction (right direction in FIG. 30) and the other end portion of the insulating film IF1 on the side of the trench T is retreated by a retreat amount Ls in the other direction (left direction in FIG. 30). The term "one direction" means a direction on the side of the drain electrode DE which will be described later and the term "the other direction" means a direction on the side of the source electrode SE which will be described later. The retreat amounts Ld and Ls are each preferably equal to or greater than the film thickness of an insulating film IF2, more specifically, 0.2 µm or greater. The retreat amounts Ld and Ls may be set at the same level. This etch back may be followed by heat treatment (annealing) for recovering the etching damage.

Then, similar to First Embodiment, an insulating film IF2, a gate electrode GE, a source electrode SE, a drain electrode DE, and the like are formed (refer to FIG. 21).

Described specifically, an insulating film IF2 is formed on the insulating film IF1 and also in the trench T and on the exposed portion of the barrier layer BA. As the insulating film (gate insulating film) IF2, for example, alumina having a thickness of about 100 nm is deposited using ALD or the like method.

Next, a gate electrode GE is formed on the insulating film IF2. For example, on the gate insulating film GI, for example, a TiN film is deposited as a conductive film by using sputtering or the like method. Then, the TiN film is patterned using photolithography and etching to form a gate electrode GE.

Upon this patterning, the gate electrode GE is patterned to have an overhang in one direction (right side, side of the drain electrode DE in FIG. 21). In other words, patterning is performed so as to provide a field plate electrode FP as a part of the gate electrode GE. This means that the field plate electrode FP is placed so as to cover therewith a first portion made of a single layer film of the insulating film IF2 and a second portion located on the side of the drain electrode DE relative to the first portion and made of a stacked film of the insulating film IF1 and the insulating film IF2.

Next, the insulating film IF1 is removed from the respective formation regions of the source electrode SE and the drain electrode DE which will be described later. Next, an insulating layer (not illustrated) is formed on the gate electrode GE and a contact hole is formed in this insulating layer by using photolithography and etching. Next, an ohmic layer (not illustrated) is formed on the insulating layer including the inside of the contact hole. For example, an Al alloy/Ti film (ohmic layer, not illustrated) is formed, followed by deposition of an aluminum film thereon by using sputtering or the like method. Next, the Al alloy/Ti film and the aluminum film are patterned using photolithography and etching to form a source electrode SE and a drain electrode DE via the ohmic layer (not illustrated).

Then, for example, a silicon oxynitride (SiON) film is deposited on the source electrode SE and the drain electrode DE by using CVD or the like method to form an insulating layer (not illustrated).

The semiconductor device shown in FIG. 21 can be manufactured by the above-mentioned steps.

In the present embodiment, similar to First Embodiment, the end portion of the insulating film IF1 on the side of the trench T is caused to retreat to the side of the drain electrode DE. This makes it possible to reduce the threshold value Vth of the channel portion at the end portion of the trench T on the side of the drain electrode DE and thereby reduce the on resistance. Further, this makes it possible to suppress generation of channel narrowing at the channel portion at the end portion of the trench T on the side of the drain electrode DE and thereby reduce the on resistance. Further, during operation of the semiconductor device, an electric field concentrated site is divided into two sites, that is, the end portion (point P1) of the insulating film IF1 on the side of the trench T and the end portion (point P2) of the field plate electrode FP of the gate electrode GE on the side of the drain electrode DE, leading to relaxation of the electric field concentration and improvement in gate breakdown voltage (refer to FIGS. 21 and 18).

Figure 31:
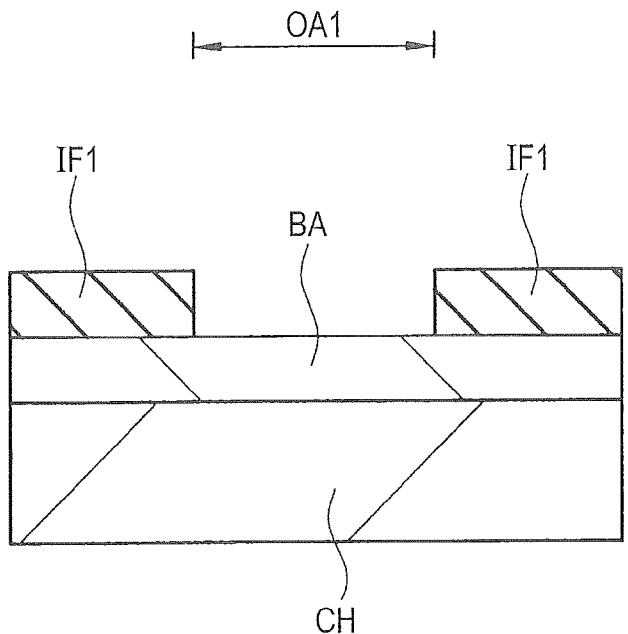
FIG. 31 is a cross-sectional view showing an alternative manufacturing step of the semiconductor device of Second Embodiment.
Figure 32:
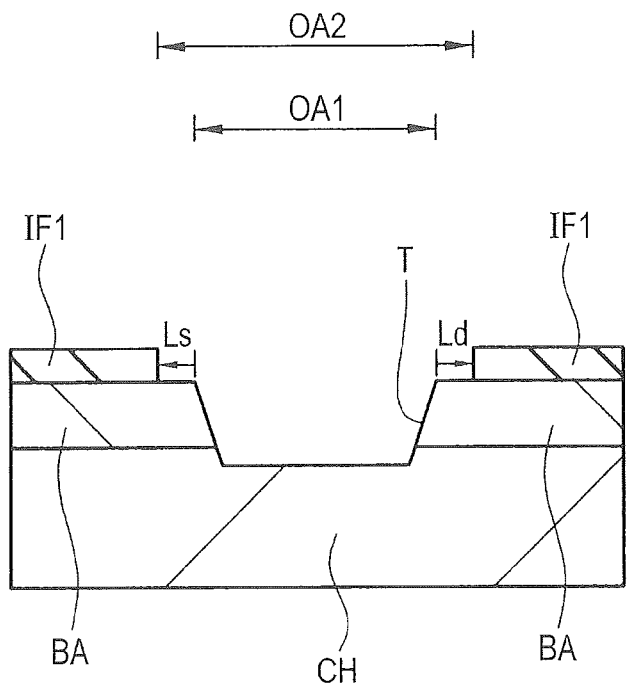
FIG. 32 is a cross-sectional view showing the alternative manufacturing step of the semiconductor device of Second Embodiment following that shown in FIG. 31.

In the above step, the masking insulating film IFM is used for causing the end portion of the insulating film IF1 on the side of the trench T to retreat to the side of the drain electrode DE, but the retreat amounts Ld and Ls may be secured by adjusting an etch selectivity of the insulating film IF1 to the barrier layer BA and the channel layer CH and making use of a film loss (retreat) from the end portion of the insulating film IF1 on the side of the trench T during formation of the trench T. FIGS. 31 and 32 are cross-sectional views showing the other manufacturing steps of the semiconductor device of the present embodiment.

As shown in FIG. 31, an insulating film IF1 is formed as a cover film on the barrier layer BA. Next, an opening portion is formed in an opening region OA1 of the insulating film IF1 by using photolithography and etching. Next, with this insulating film IF1 as a mask, the barrier layer BA and the channel layer CH are etched. By regulating the etching conditions, a film loss of the insulating film IF1 is used and a predetermined thickness of the insulating film IF1 is etched from the surface of the insulating film IF1 and also from the sidewall of the trench T. This makes it possible to cause the insulating film IF1 to retreat from the sidewall of the trench T. In this case, for example, the retreat amounts Ld and Ls can be controlled within a range of from 5 nm to 0.1 μm.

In order to secure large retreat amounts Ld and Ls with good controllability, for example, to secure retreat amounts (Ld and Ls) equal to or greater than the thickness of the insulating film IF2 or equal to or greater than 0.2 μm, the above-mentioned step using the masking insulating film FM is preferred.

The above-mentioned steps are only exemplary and the semiconductor device of the present embodiment may be manufactured using steps other than the above-mentioned ones.

(Evaluation Results)

Evaluation results of various characteristics (on resistance, S value, and electric field intensity) of the semiconductor device (FIG. 21) of the present embodiment will hereinafter be described. The retreat amounts Ld and Ls were set at Ld≈Ls. The gate length (width of the opening region OA2), the length of the field plate electrode, and the distance between the gate electrode GE and the drain electrode DE were set at 1 μm, 2 μm, and 10 μm, respectively.

Figure 33:
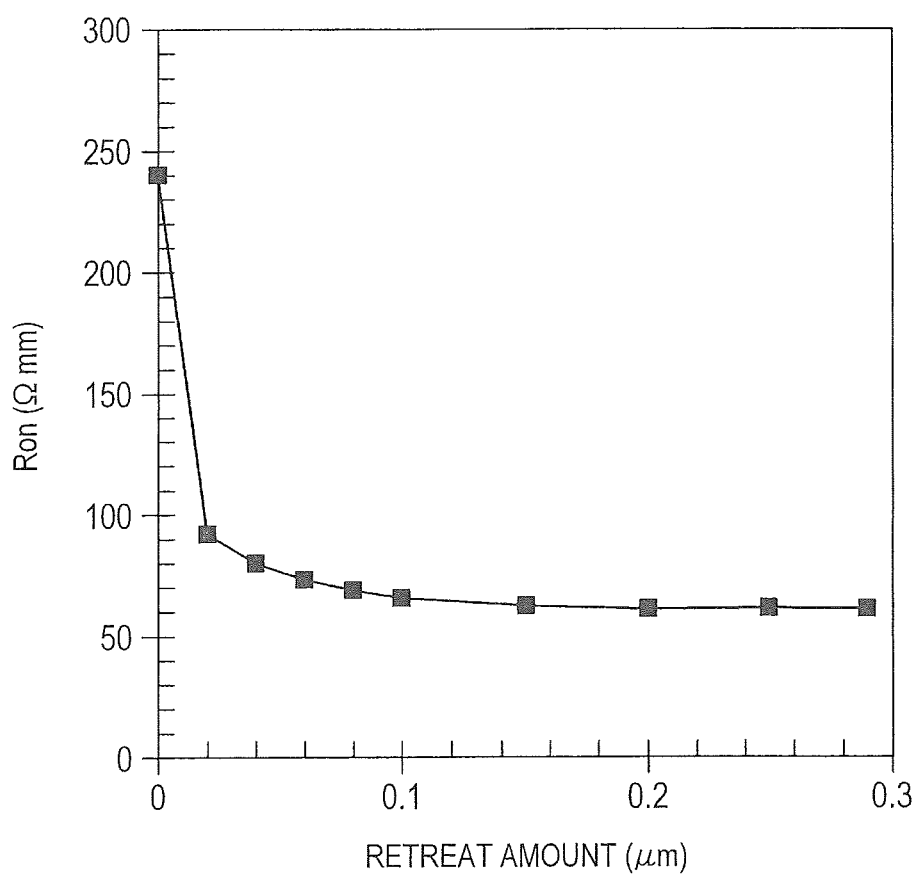
FIG. 33 is a graph showing the relationship of the semiconductor device between on resistance and retreat amount.

FIG. 33 is a graph showing the relationship of the semiconductor device between the on resistance and the retreat amount. The on resistance Ron [Ω mm] is plotted along the ordinate, while the retreat amount Ld [μm] is plotted along the abscissa. The on resistance Ron is a sum (Ron=Rch+Ras+Rad) of a channel resistance Rch generated along the bottom surface of the trench T, a channel resistance Ras generated along the side surface of the trench T on the side of the source electrode SE, and a channel resistance Rad generated along the side surface of the trench T on the side of the drain electrode DE. As biasing conditions, the drain voltage Vd and the gate voltage Vg were set at 0.1V and 10V, respectively. Further, the thickness of alumina as the insulating film IF2, the remaining thickness of the insulating film IF1, the depth of the trench T, and the taper angle were set at 100 nm, 60 nm, 40 nm, and about 90°, respectively.

In the semiconductor device under the above-mentioned conditions, the on resistance Ron decreases with an increase in the retreat amount Ld as shown in FIG. 33. For example, a decrease in the on resistance Ron is observed even at the retreat amount Ld of about 0.02 μm. It has been revealed that at the retreat amount Ld of about 0.1 μm, the on resistance Ron shows a sufficient decrease; and at the retreat amount Ld of 0.2 μm or greater, the on resistance Ron becomes almost constant, which is almost the same level as that when the whole insulating film IF1 is removed (Ld: to ∞).

Figure 34:
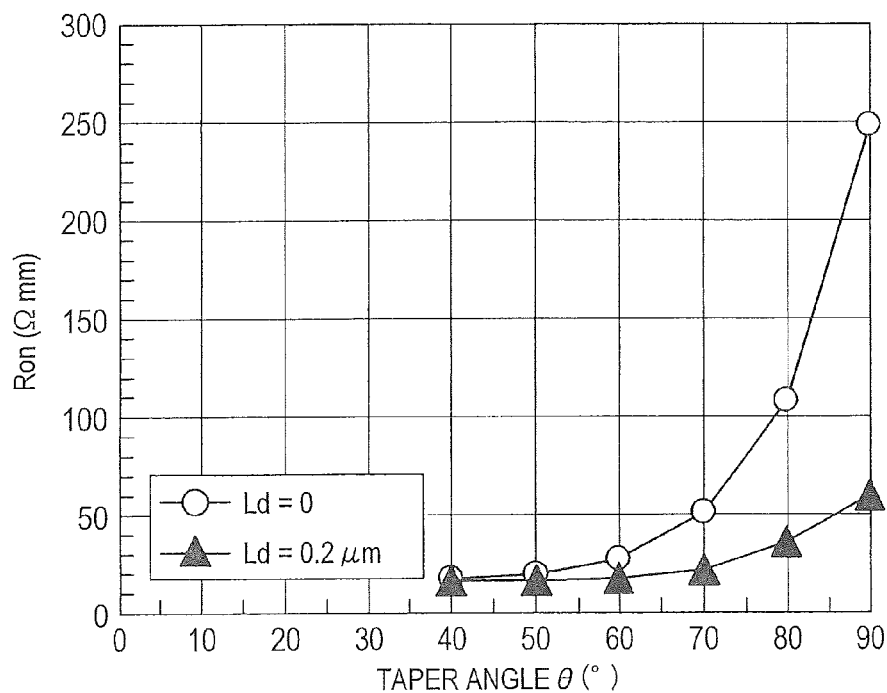
FIG. 34 is a graph showing the relationship of the semiconductor device between on resistance and taper angle.

Next, the relationship, between the on resistance Ron and the taper angle θ [°], of each of a semiconductor device set at a retreat amount Ld of 0 (no retreat) and a semiconductor device set at a retreat amount Ld of 0.2 μm was studied. FIG. 34 is a graph showing the relationship of each of the semiconductor devices between the on resistance and the taper angle. The on resistance Ron is plotted along the ordinate, while the taper angle θ [°] is plotted along the abscissa.

When the retreat amount Ld is 0 (no retreat), the on resistance increases with an increase in taper angle θ. It has been revealed that even when the retreat amount LD is 0.2 μm, the on resistance Ron increases with an increase in taper angle θ, but an increase rate is smaller than that of the above case. It has also been revealed that when the insulating film IF1 is caused to retreat from the end portion on the side of the trench T at a taper angle within a range of from 50 to 90°, the on resistance Ron can be decreased compared with the case where the insulating film is not caused to retreat. In particular, it has been revealed that even when the taper angle θ is adjusted to from 70 to 80° under ordinary etching conditions, the on resistance Ron can be made smaller when the insulating film IF1 is caused to retreat from the end portion on the side of the trench T than when the insulating film is not caused to retreat and the on resistance can be decreased to from about 40 to 300 of the on resistance when the insulating film is not caused to retreat.

As described above, when alumina is used as the insulating film (gate insulating film) IF2, it is highly effective for compensating for the negative polarization charge (e) of the surface of the AlGaN layer which is the barrier layer BA so that the negative polarization charge (e) at the interface between alumina and AlGaN can be reduced. As a result, channel narrowing in the channel portion at the end portion of the trench T on the side of the drain electrode DE can be suppressed.

Thus, by causing the insulating film IF1 to retreat from the end portion on the side of the trench T, two effects can be achieved. Effect 1 can shorten the distance between the field plate electrode FP of the gate electrode GE and the barrier layer BA (semiconductor region, nitride semiconductor region) and thereby reduce the on resistance. Effect 2 of compensating for the negative polarization charge (e) is produced by alumina. The effect of suppressing the on resistance shown in FIG. 34 can therefore be confirmed.

Figure 35:
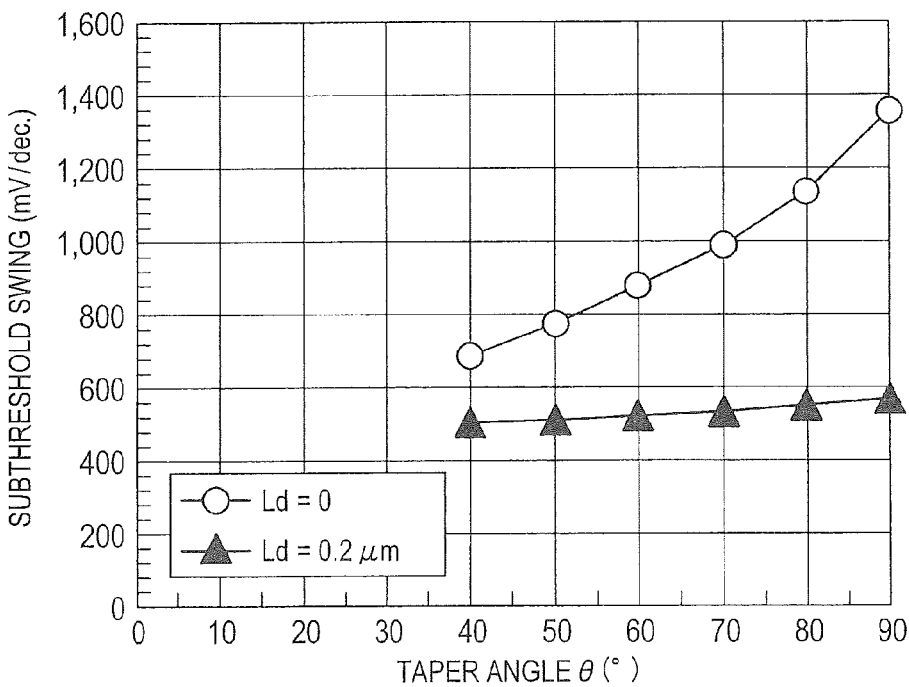
FIG. 35 is a graph showing the relationship of the semiconductor device between S value and taper angle.

Next, with regard to semiconductor devices having a retreat amount Ld set at 0 (no retreat) and a retreat amount Ld set at 0.2 μm, respectively, the relationship between S value and taper angle θ [°] was studied. FIG. 35 is a graph showing the relationship of the semiconductor device between S value and taper angle. The S value [mV/dec.] is plotted along the ordinate, while the taper angle θ [°] is plotted along the abscissa. The S value [mV/dec.] is a value (subthreshold swing) showing sharpness of transition from on-state to off-state. This S value is preferably smaller in an ordinary application. The S value was defined at a drain current Id of from $1\times10^{-5}$ (1E-5) to $1\times10^{6}$ (1E-6) [A/mm] as a result of sweeping a gate voltage Vg while applying a drain voltage Vd of 0.1V.

When the retreat amount Ld is 0 (no retreat), the S value increases with an increase in the taper angle θ. When the retreat amount Ld is 0.2 μm, even an increase in the taper angle θ causes no substantial change in S value. It has therefore been revealed that there is almost no dependence of the S value on the taper angle θ.

It has therefore be revealed that using the configuration of the semiconductor device in which the insulating film IF1 is caused to retreat from the end portion on the side of the trench T leads to a drastic reduction in on resistance and further, a drastic improvement in S value, which is presumed to occur due to the above-mentioned Effect 1 and Effect 2.

Figure 36:
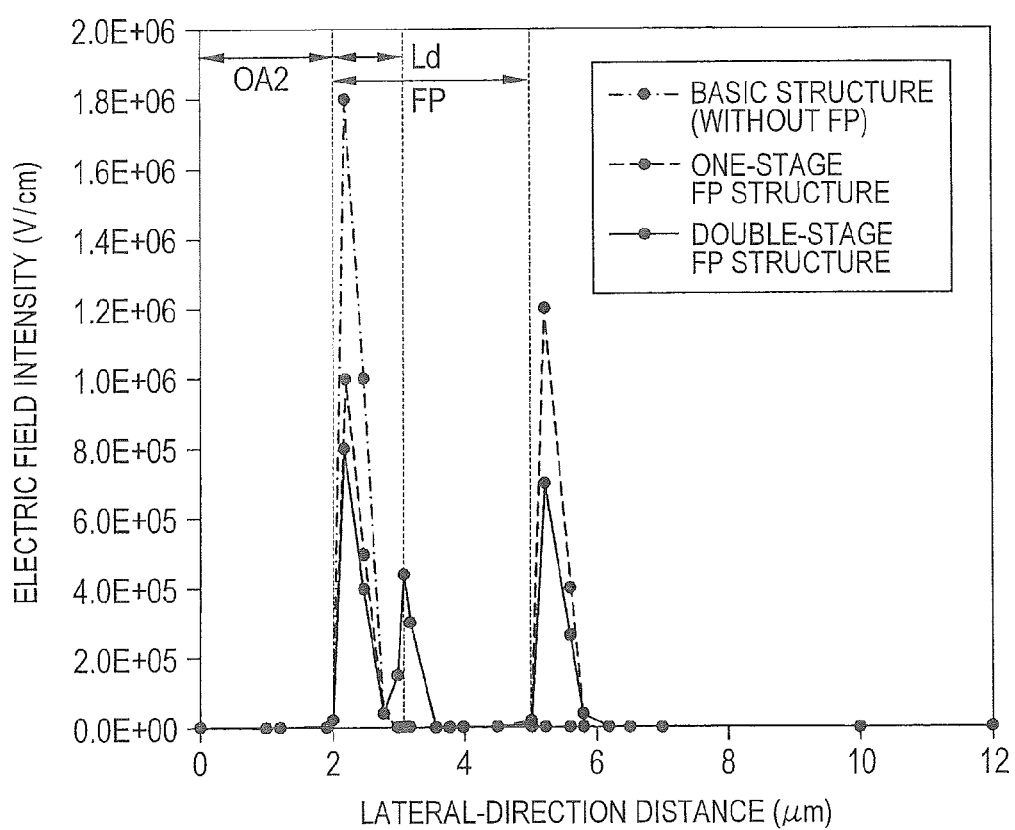
FIG. 36 is a graph showing an electric field intensity distribution of semiconductor devices having a retreat amount Ld of 0, having a retreat amount Ld of 0.2 μm, and having no field plate electrode, respectively.

Next, with regard to semiconductor devices having, among the above-mentioned conditions, a retreat amount Ld of 0 (no retreat), having a retreat amount Ld of 0.2 μm, and having no field plate electrode FP, respectively, the electric field intensity distribution in a region (site) extending with the same depth from the end portion of the bottom surface of the trench T on the side of the source electrode SE to the direction of the drain electrode DE was studied. FIG. 36 is a graph showing an electric field intensity distribution of the semiconductor devices having a retreat amount Ld of 0, having a retreat amount Ld of 0.2 µm, and having no field plate electrode FP, respectively.

The electric field intensity [V/cm] is plotted along the ordinate, while the distance [µm], in a lateral direction, of a region (site) extending with the same depth from the end portion of the bottom surface of the trench T on the side of the source electrode SE in the direction of the drain electrode DE is plotted along the abscissa. The electric field intensity was in an off-state (gate voltage Vg=0V) at a drain voltage Vd of 100V and it was determined using two-dimensional device simulation. In addition, the gate length (width of the opening region OA2) was set at 2 µm, the length of the field plate electrode at 3 µm, and the distance between the gate electrode GE and the drain electrode DE at 10 µm. Further, the film thickness of alumina as the insulating film IF2 was set at 100 nm, the remaining thickness of the insulating film IF1 at 60 nm, the depth of the trench T at 40 nm, and the angle (taper angle θ) between the sidewall of the trench T and the extension of the bottom surface of the trench T at about 90°.

Figure 37:
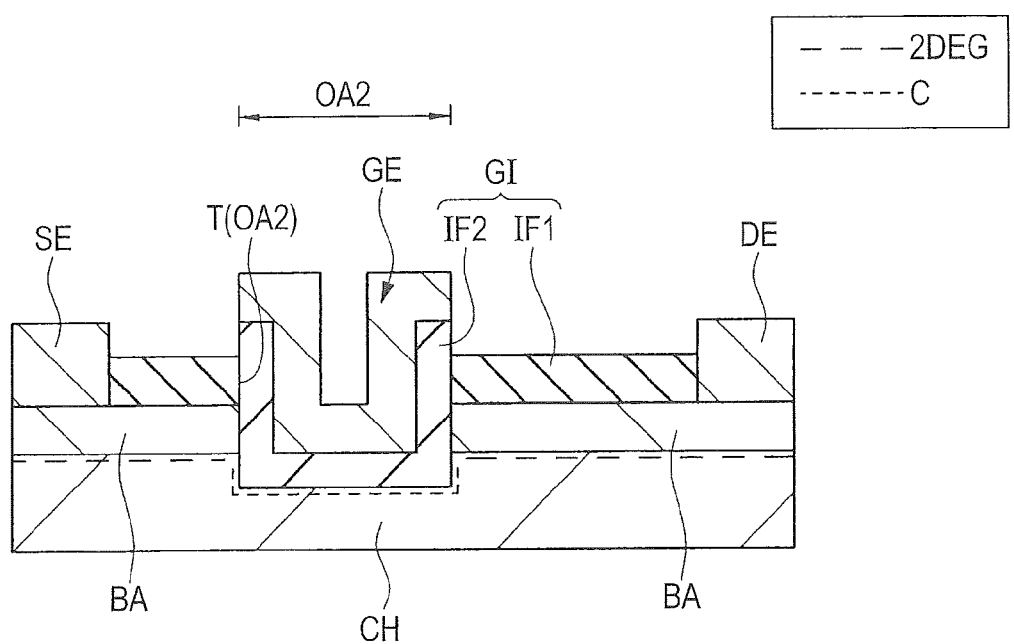
FIG. 37 is a cross-sectional view schematically showing the configuration of the semiconductor device having no field plate electrode.

FIG. 36 shows electric field intensity distribution of each of three semiconductor devices, that is, (1) a semiconductor device (basic structure, reference) having no field plate electrode FP; (2) a semiconductor device having a retreat amount Ld of 0, more specifically, a semiconductor device (semiconductor device with a one-stage FP structure) of Comparative Example as shown in FIG. 17; and (3) a semiconductor device having a retreat amount Ld of 1 µm, more specifically, a semiconductor device (semiconductor device with a two-stage FP structure). FIG. 37 is a cross-sectional view schematically showing the configuration of the semiconductor device (1) having no field plate electrode FP. In the semiconductor device shown in FIG. 37, the end portion of the insulating film IF1 on the side of the trench T is not caused to retreat to the side of the drain electrode DE and further, no field plate electrode FP is provided which extends from the end portion of the trench T on the side of the drain electrode DE to the side of the drain electrode DE.

As is apparent from FIG. 36, the semiconductor device (basic structure, reference) (1) having no field plate electrode FP shows a high concentration of electric field on the end portion of the gate electrode GE on the side of the drain electrode DE. This semiconductor device is therefore easily broken at the end portion.

The electric field concentration of the semiconductor device (2) having a retreat amount Ld of 0 (one-stage FP structure) at the end portion of the gate electrode GE on the side of the drain electrode DE is greatly relaxed compared with the semiconductor device of (1). A relatively high electric field concentration is however observed at the end portion of the field plate electrode FP on the side of the drain electrode DE. This semiconductor device is therefore easily broken at the end portion of the field plate electrode FP on the side of the drain electrode DE. Also in evaluation of breakdown voltage of an actual semiconductor device, deterioration in breakdown voltage is observed at the end portion of the field plate electrode FP on the side of the drain electrode DE.

Figure 18:
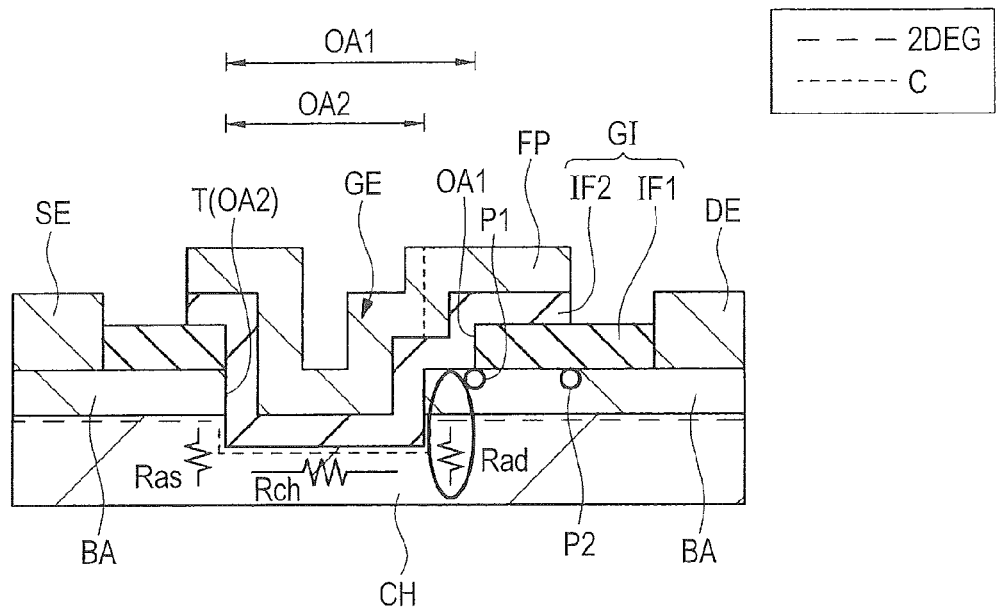
FIG. 18 is a cross-sectional view schematically showing the configuration of the semiconductor device of First Embodiment in the vicinity of a gate electrode thereof.

In the semiconductor device (3) having a retreat amount Ld of 1 µm, on the other hand, the electric field concentration is dispersed into two sites, that is, the end portion (above-mentioned point P1) of the insulating film IF1 on the side of the trench T and the end portion (the above-mentioned point P2) of the field plate electrode FP of the gate electrode GE on the side of the drain electrode DE (refer to FIG. 18). The electric field concentration at the end portion of the field plate electrode FP on the side of the drain electrode DE is greatly relaxed compared with that of the semiconductor device (2). Also the electric field concentration at the end portion of the gate electrode GE on the side of the drain electrode DE is relaxed compared with the semiconductor device (2). When a drain voltage Vd of 100V is applied, the maximum electric field intensity can be suppressed even to a level of about 8.0E+05 ($8\times10^5$) [V/cm]. These results show that in a region from the end portion of the bottom surface of the trench T on the side of the source electrode SE to the end portion of the field plate electrode FP on the side of the drain electrode DE, overall relaxation of electric field concentration can be observed. Due to this relaxation, the semiconductor device thus obtained has an improved off-state breakdown voltage characteristic.

According to the semiconductor device (semiconductor device having a two-stage FP structure) of the present embodiment, as described above, electric field concentration below the field plate electrode FP is relaxed and gate breakdown voltage is improved. Moreover, the length of the field plate electrode FP can be shortened and therefore the distance between the gate electrode GE and the drain electrode DE can be shortened. This makes it possible to provide a downsized and highly integrated device.

In First Embodiment and Second Embodiment, described in detail was a reduction of on resistance by suppressing the channel C at the end portion of the trench T on the side of the drain electrode DE from having an effectively high threshold value Vth. It is also possible to improve the threshold value Vth, for example, set it at Vth≥2V and thereby stabilize the normally-off characteristic. For example, the threshold value Vth may be improved and the normally-off characteristic is stabilized more by using an AlGaN layer as the buffer layer BU and making use of a negative polarization charge at the interface (GaN/AlGaN) between the channel layer CH (GaN layer) and the buffer layer BU (AlGaN layer) to lift up the electric potential at the lower end of a conduction band.

(Third Embodiment)

Figure 38:
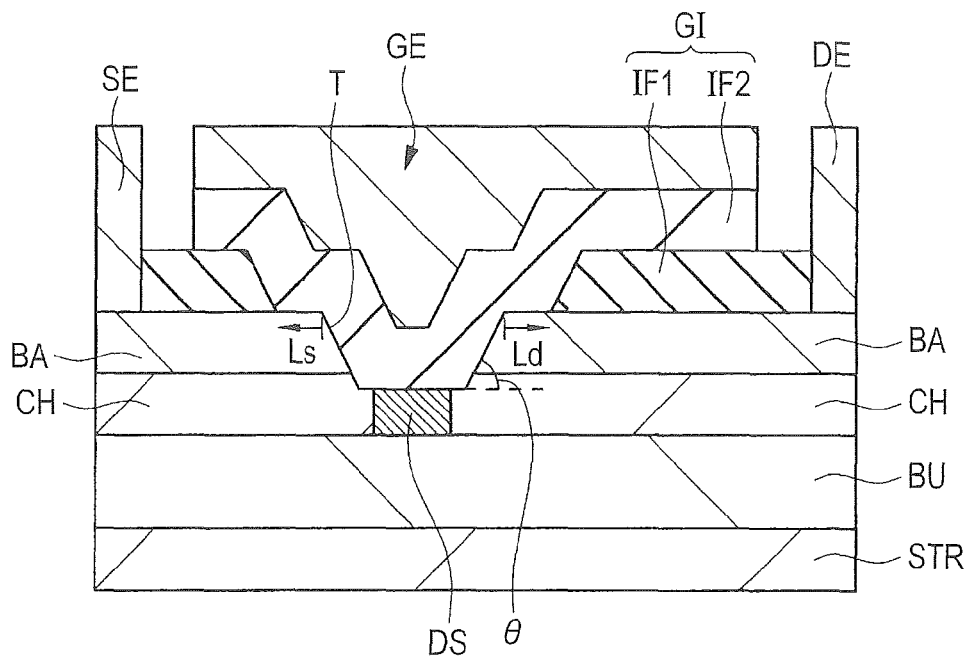
FIG. 38 is a cross-sectional view schematically showing the configuration of a semiconductor device of Third Embodiment.

In the present embodiment, a description will be made on an example of improving a threshold value Vth and stabilizing a normally-off characteristic further by forming an impurity-containing semiconductor region in a channel portion. FIG. 38 is a cross-sectional view schematically showing the configuration of a semiconductor device of the present embodiment.

[Description on Structure]

In the semiconductor device of the present embodiment, as shown in FIG. 38, the trench T has, at the bottom surface thereof, that is, in a region where a channel is to be formed, a semiconductor region DS containing an impurity. The other configuration is similar to that of Second Embodiment (FIG. 21) so that a detailed description on it is omitted. Described specifically, in the semiconductor device of the present embodiment, the end portion of the insulating film IF1 on the side of the trench T on the side of the drain electrode DE is caused to retreat by a retreat amount Ld to the side of the drain electrode DE and further, the end portion of the insulating film IF1 on the side of the trench T on the side of the source electrode SE is caused to retreat by a retreat amount Ls to the side of the source electrode SE. In addition, the angle between the side surface (sidewall) of the trench T and the extension of the bottom surface of the trench T is less than 90°.

[Description on Manufacturing Method]

Next, referring to FIGS. 39 to 45, a method of manufacturing the semiconductor device of the present embodiment will be described and at the same time, the configuration of the semiconductor device will be shown more clearly. FIGS. 39 to 45 are cross-sectional views showing the manufacturing steps of the semiconductor device of the present embodiment. A detailed description on steps similar to those of First Embodiment or Second Embodiment will be omitted.

First, similar to First Embodiment, a stacked body of a nucleus forming layer NUC, a strain relaxing layer STR, a buffer layer BU, a channel layer CH, and a barrier layer BA is formed on a substrate S (refer to FIG. 2).

Figure 39:
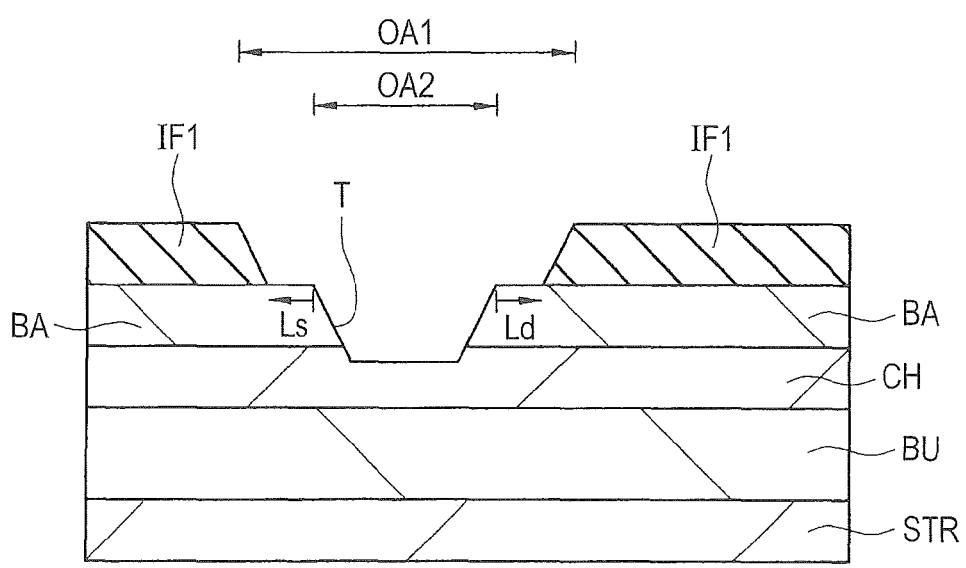
FIG. 39 is a cross-sectional view showing a manufacturing step of the semiconductor device of Third Embodiment.

Next, as shown in FIG. 39, an insulating film IF1 is formed as a cover film on the barrier layer BA. Described specifically, as the insulating film IF1, for example, a silicon nitride film having a thickness of about 900 angstrom is deposited by using CVD or the like method. Then, similar to Second Embodiment, an opening portion of the insulating film IF1 is formed in an opening region OA2. The barrier layer BA and the channel layer CH in the opening region OA2 are then etched to form a trench T. The angle (taper angle θ) between the sidewall of this trench T and the extension of the bottom surface of the trench T is less than 90°. The insulating film IF1 in the opening region OA1 is then etched to cause the end portion of the insulating film IF1 to retreat. The opening region OA2 is located at a substantially center portion of the opening region OA1.

Figure 40:
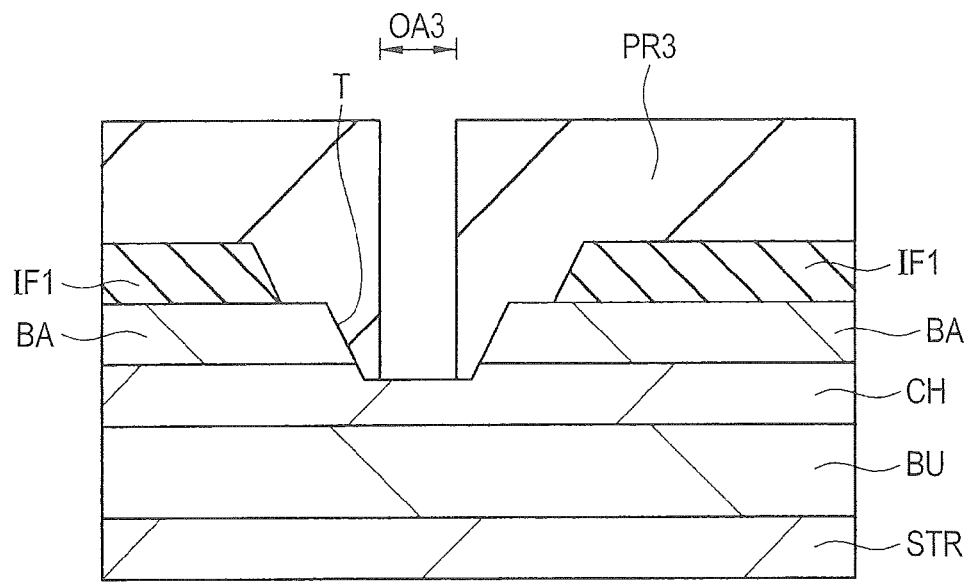
FIG. 40 is a cross-sectional view showing a manufacturing step of the semiconductor device of Third Embodiment following the step shown in FIG. 39.

Next, as shown in FIG. 40, a photoresist film PR3 having an opening portion in an opening region OA3 is formed using photolithography. The opening region OA3 is located at a substantially center portion of the opening region OA2.

Figure 41:
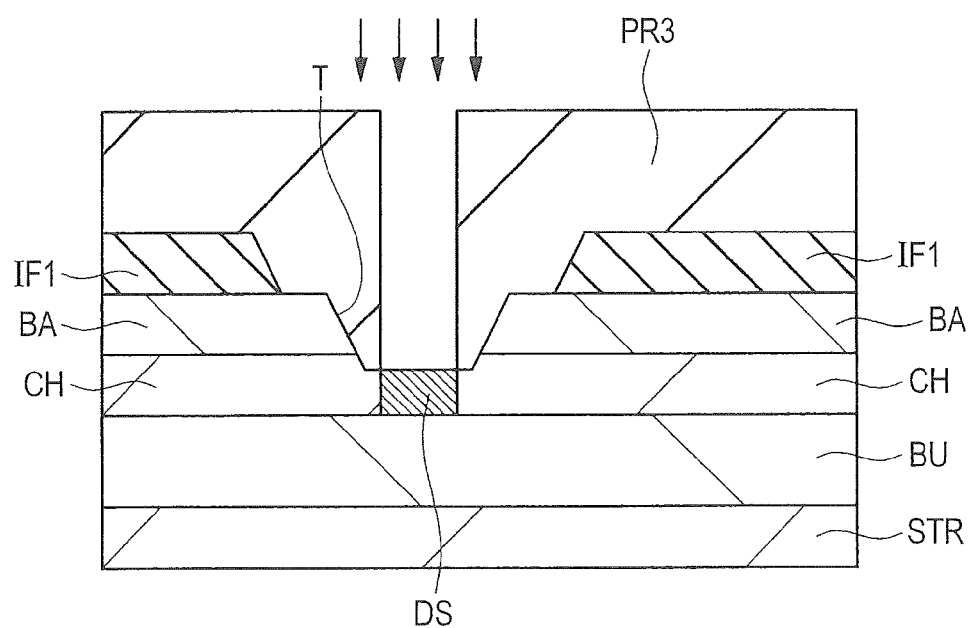
FIG. 41 is a cross-sectional view showing a manufacturing step of the semiconductor device of Third Embodiment following the step shown in FIG. 40.

Next, as shown in FIG. 41, with the photoresist film PR3 as a mask, an impurity ion is implanted into the channel layer CH in the opening region OA3. As a result, a semiconductor region DS containing an impurity is formed at the bottom surface of the trench T.

Figure 42:
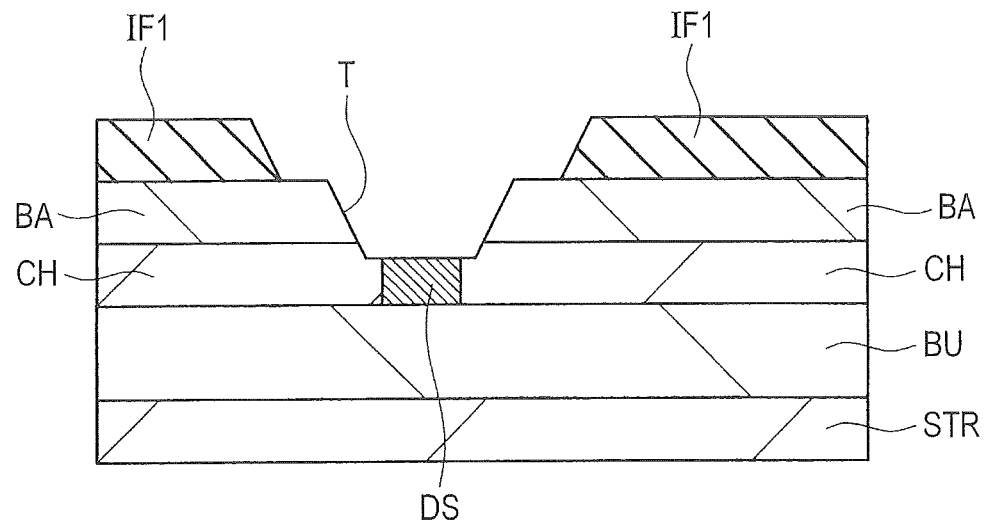
FIG. 42 is a cross-sectional view showing a manufacturing step of the semiconductor device of Third Embodiment following the step shown in FIG. 41.

Here, ion implantation into the channel layer (GaN layer) CH is performed using Mg (magnesium) having a concentration of $1E18/cm^2$ ($1\times10^{18}/cm^2$) as an impurity at an implantation energy of from 10 KeV to 15 KeV. As a result, a semiconductor region DS containing a p type impurity can be formed. Alternatively, F (fluorine) may be introduced as an impurity into a channel layer (epi-layer substrate) CH. $CF_4$ Plasma treatment is effective for implantation of fluorine (F) as an impurity. When a sample is exposed to $CF_4$ plasma, fluorine ion ($F^-$) is introduced into the channel layer (epi-layer substrate) CH. More specifically, treatment in a reactive ion etching apparatus with electricity of, for example, about 135 W for about 200 seconds is recommended. After plasma treatment, however, heat treatment at 400° C. for about 10 minutes is preferably conducted in order to recover a surface damage due to $CF_4$ plasma treatment. In this example, the height of the bottom surface of the semiconductor region DS is made almost equal to the height of the surface of the buffer layer BU, but it is only necessary that the semiconductor region DS is placed in a formation region of a channel. The bottom surface of the semiconductor region DS may be higher than the bottom surface of the channel layer CH or the bottom surface of the semiconductor region DS may be lower than the surface of the buffer layer BU. Next, as shown in FIG. 42, the photoresist film PR3 is removed by plasma stripping treatment or the like.

Figure 43:
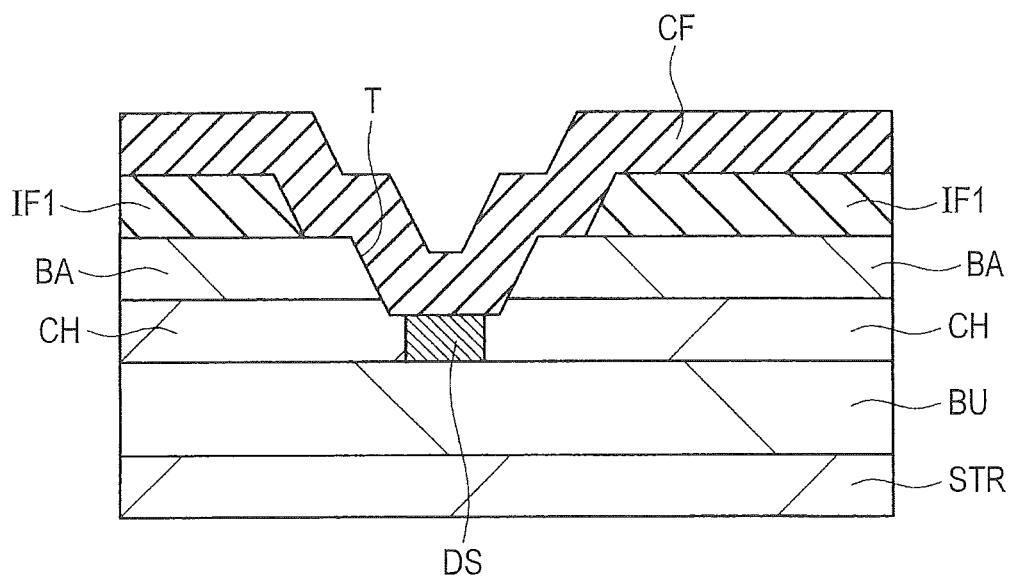
FIG. 43 is a cross-sectional view showing a manufacturing step of the semiconductor device of Third Embodiment following the step shown in FIG. 42.

Next, as shown in FIG. 43, a cover film (which may also be called "protective film") CF is formed on the insulating film IF1 including the inside of the trench T. As the cover film CF, for example, a silicon oxide film is deposited using CVD or the like method. Next, heat treatment (annealing) is performed in order to activate the impurity (Mg in this example). Then, the cover film CF is removed by etching or the like.

Figure 44:
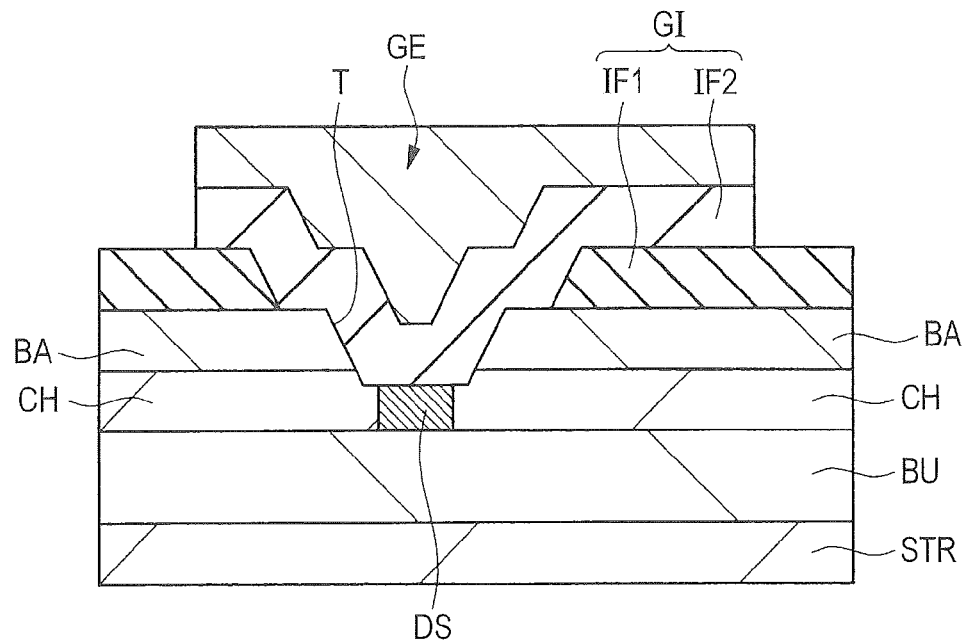
FIG. 44 is a cross-sectional view showing a manufacturing step of the semiconductor device of Third Embodiment following the step shown in FIG. 43.

Next, as shown in FIG. 44, an insulating film IF2 and a gate electrode GE are formed. The insulating film IF2 and the gate electrode GE can be formed in a similar manner to that employed in First Embodiment or Second Embodiment (refer to FIG. 13).

Figure 45:
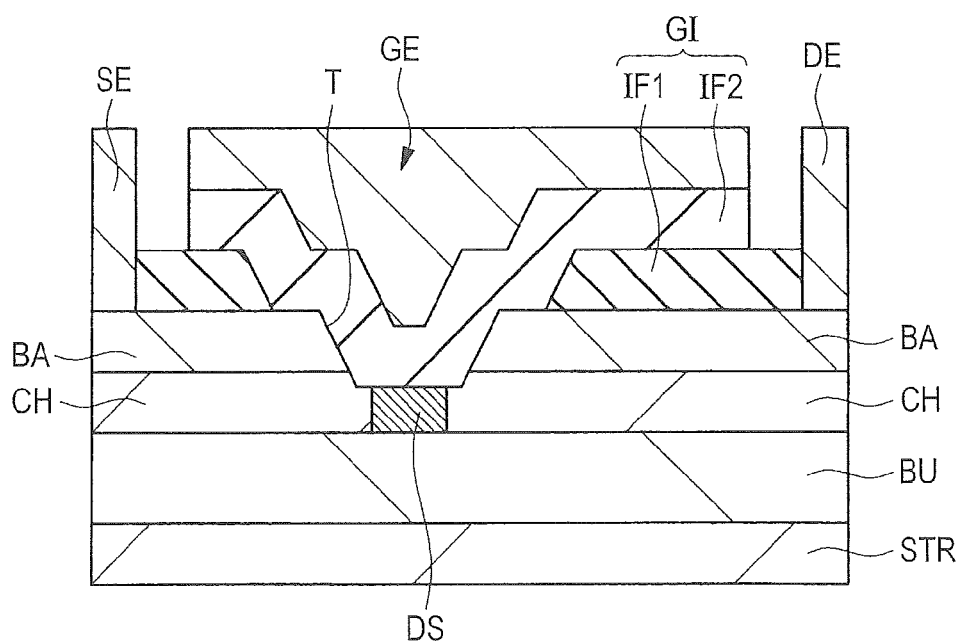
FIG. 45 is a cross-sectional view showing a manufacturing step of the semiconductor device of Third Embodiment following the step shown in FIG. 44.

Next, as shown in FIG. 45, a source electrode SE and a drain electrode DE are formed. The source electrode SE and the drain electrode DE can be formed in a similar manner to that employed in First Embodiment or Second Embodiment (refer to FIGS. 14 to 16).

Also in this embodiment, the end portion of the insulating film IF1 on the side of the trench T is caused to retreat to the side of the drain electrode DE as in First Embodiment or Second Embodiment so that an on resistance can be reduced. In addition, an electric field concentration is relaxed and gate breakdown voltage is improved (refer to FIGS. 21 and 18).

Moreover, since the semiconductor region DS containing the p type impurity or fluorine (fluorine anion) is formed at the bottom surface of the trench T, that is, in the channel formation region, the electric potential at this region is lifted up, making it possible to improve the threshold value Vth and stabilize the normally-off characteristic further.

The above-mentioned step is just one example. The semiconductor device of the present embodiment may be manufactured by steps other than the above-mentioned ones.
(Fourth Embodiment)

Figure 46:
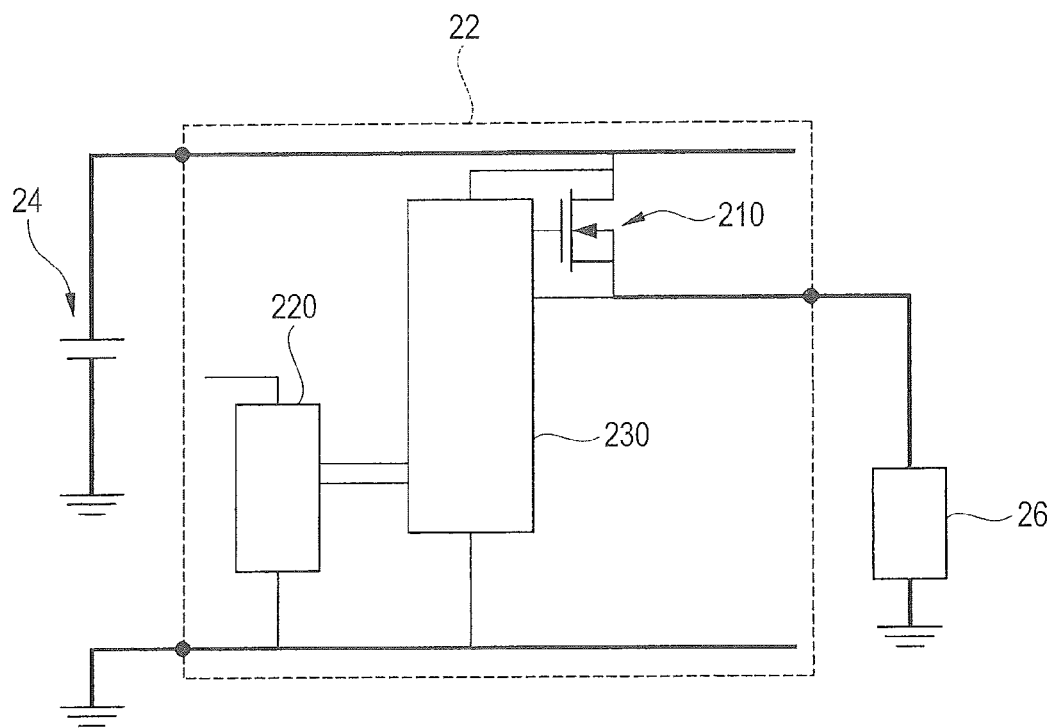
FIG. 46 is a circuit diagram showing the configuration of an electronic device of Fourth Embodiment.

Although no limitation is imposed on an electronic device to which the semiconductor device (transistor) described above in First to Third Embodiments is applied, it can be applied to, for example, an electronic device shown in FIG. 46. FIG. 46 is a circuit diagram showing the configuration of an electronic device of the present embodiment.

An electronic device 22 shown in FIG. 46 is an electronic device to be used for vehicles and it is coupled to a power source 24 and a load 26. The power source 24 is, for example, an in-car battery. The load 26 is, for example, an in-car electronic part, for example, a motor which will be a power source of a head lamp or power window or a power source of a vehicle. This electronic device 22 controls electricity to be supplied from the power source 24 to the load 26.

The electronic device 22 has a semiconductor device having a transistor 210, a semiconductor device 220, and a control circuit 230 mounted on a circuit board (for example, printed circuit board). The semiconductor device 220 has a microcomputer and is coupled to the transistor 210 via a wiring of the circuit board. The semiconductor device 220 controls the transistor 210 via the control circuit 230.

Described specifically, the semiconductor device 220 inputs a control signal to the control circuit 230. The control circuit 230 then inputs a single to the gate electrode of the transistor 210 according to the control signal input from the semiconductor device 220. In such a manner, the semiconductor device 220 controls the transistor 210 via the control circuit 230. This transistor 210 is controlled, whereby electricity from the power source 24 is supplied to the load 26 as needed.

For example, the semiconductor device (transistor) described above in First to Third Embodiments can be applied to the transistor 210 of this electronic device 22.

The invention made by the present inventors has been described specifically based on some embodiments. The invention is not limited to the above-mentioned embodiments and needless to say, it can be changed in various ways without departing from the scope of the invention. For example, the semiconductor region DS of Third Embodiment may be applied to the semiconductor device of First Embodiment (FIG. 1).

What is claimed is:

1. A semiconductor device, comprising:
    a first nitride semiconductor layer formed over a substrate;
    a second nitride semiconductor layer formed over the first nitride semiconductor layer and having a band gap wider than that of the first nitride semiconductor layer;
    a trench penetrating through the second nitride semiconductor layer and reaching an inside of the first nitride semiconductor layer;
    a gate electrode placed in the trench above a gate insulating film;
    a first electrode and a second electrode formed over the second nitride semiconductor layer on both sides of the gate electrode, respectively,
    wherein the gate insulating film includes:
        a first portion extending from an end portion of the trench toward the first electrode, and located on a side of the end portion of the trench;
        a second portion located between the first electrode and the first portion, having a film thickness greater than that of the first portion, and including a first side surface facing the first electrode; and
        a third portion located between the first electrode and the second portion, having a film thickness less than the film thickness of the second portion, and including a second side surface facing the first electrode; and
    an insulating layer disposed on the first side surface, the second side surface, and an upper surface of the third portion, the insulating layer extending from the first electrode to reach to the first side surface of the second portion,
    wherein the first side surface and the second side surface each contact the upper surface of the third portion.

2. The semiconductor device according to claim 1, wherein the first portion includes a second film placed over the second nitride semiconductor layer, and
    wherein the second portion includes a first film and the second film, the second film being placed over the second nitride semiconductor layer and the first film.

3. The semiconductor device according to claim 2, wherein the second film comprises a film containing aluminum oxide.

4. The semiconductor device according to claim 3, wherein the first film comprises a film containing silicon nitride.

5. The semiconductor device according to claim 1, wherein the trench comprises a tapered side wall.

6. The semiconductor device according to claim 5, wherein an angle between a side surface of the trench and an extension of a bottom surface of the trench is 90° or less.

7. The semiconductor device according to claim 6, wherein the angle is 70° or greater but not greater than 90°.

8. The semiconductor device according to claim 2, wherein a distance between the end portion of the trench and the first film is equal to or greater than a thickness of the second film.

9. The semiconductor device according to claim 8, wherein the distance between the end portion of the trench and the first film is 0.2 µm or greater.

10. The semiconductor device according to claim 2, wherein a distance between the end portion of the trench and the first film is 5 nm or greater but not greater than 0.1 µm.

11. The semiconductor device according to claim 1, wherein the insulating layer is disposed on an upper surface of the second portion of the gate insulating film.

12. The semiconductor device according to claim 1, wherein the second portion includes a first film and a second film, the second film being placed over the second nitride semiconductor layer and the first film, and
    wherein the insulating layer is disposed on an upper surface of the second portion of the gate insulating film.

* * * * *